United States Patent
Narayanan et al.

(10) Patent No.: US 9,741,765 B1
(45) Date of Patent: Aug. 22, 2017

(54) MONOLITHICALLY INTEGRATED RESISTIVE MEMORY USING INTEGRATED-CIRCUIT FOUNDRY COMPATIBLE PROCESSES

(71) Applicant: Crossbar, Inc., Santa Clara, CA (US)

(72) Inventors: Sundar Narayanan, Cupertino, CA (US); Steve Maxwell, Sunnyvale, CA (US); Natividad Vasquez, Jr., San Francisco, CA (US); Harry Yue Gee, Santa Clara, CA (US)

(73) Assignee: CROSSBAR, INC., Santa Clara, CA (US)

(*) Notice: Subject to any disclaimer, the term of this patent is extended or adjusted under 35 U.S.C. 154(b) by 0 days.

(21) Appl. No.: 14/588,136

(22) Filed: Dec. 31, 2014

Related U.S. Application Data

(60) Provisional application No. 61/937,412, filed on Feb. 7, 2014.

(51) Int. Cl.
- *H01L 27/092* (2006.01)
- *H01L 45/00* (2006.01)
- *H01L 27/24* (2006.01)

(52) U.S. Cl.
CPC ........ *H01L 27/2463* (2013.01); *H01L 27/092* (2013.01); *H01L 45/1233* (2013.01); *H01L 45/1253* (2013.01); *H01L 45/16* (2013.01)

(58) Field of Classification Search
CPC ... H01L 27/092; H01L 45/16; H01L 45/1683; H01L 45/1226
See application file for complete search history.

(56) References Cited

U.S. PATENT DOCUMENTS

| | | |
|---|---|---|
| 680,652 A | 8/1901 | Leonard |
| 4,433,468 A | 2/1984 | Kawamata |

(Continued)

FOREIGN PATENT DOCUMENTS

| | | |
|---|---|---|
| CN | 101131872 A | 2/2008 |
| CN | 101170132 A | 4/2008 |

(Continued)

OTHER PUBLICATIONS

Advisory Action mailed Jun. 8, 2012 for U.S. Appl. No. 12/835,704, filed Jul. 13, 2012.

(Continued)

*Primary Examiner* — Michael Carter
(74) *Attorney, Agent, or Firm* — Amin, Turocy & Watson, LLP

(57) ABSTRACT

Provided is a monolithic integration of resistive memory with complementary metal oxide semiconductor using integrated circuit foundry processes. A memory device is provided that includes a substrate comprising one or more complementary metal-oxide semiconductor devices, a first insulator layer formed on the substrate; and a monolithic stack. The monolithic stack includes multiple layers fabricated as part of a monolithic process over the first insulator layer. The multiple layers include a first metal layer, a second insulator layer, and a second metal layer. A resistive memory device structure is formed within the second insulator layer and within a thermal budget of the one or more complementary metal-oxide semiconductor devices. The resistive memory device structure is implemented as a pillar device or as a via device. Further, the first metal layer is coupled to the second metal layer.

20 Claims, 9 Drawing Sheets

(56) References Cited

U.S. PATENT DOCUMENTS

| | | |
|---|---|---|
| 4,684,972 A | 8/1987 | Owen et al. |
| 4,741,601 A | 5/1988 | Saito |
| 4,994,866 A * | 2/1991 | Awano ............ H01L 21/823807 |
| | | 257/190 |
| 5,139,911 A | 8/1992 | Yagi et al. |
| 5,242,855 A | 9/1993 | Oguro |
| 5,278,085 A | 1/1994 | Maddox, III et al. |
| 5,315,131 A | 5/1994 | Kishimoto et al. |
| 5,335,219 A | 8/1994 | Ovshinsky et al. |
| 5,360,981 A | 11/1994 | Owen et al. |
| 5,457,649 A | 10/1995 | Eichman et al. |
| 5,499,208 A | 3/1996 | Shoji |
| 5,538,564 A | 7/1996 | Kaschmitter |
| 5,541,869 A | 7/1996 | Rose et al. |
| 5,594,363 A | 1/1997 | Freeman et al. |
| 5,596,214 A | 1/1997 | Endo |
| 5,614,756 A | 3/1997 | Forouhi et al. |
| 5,627,451 A | 5/1997 | Takeda |
| 5,645,628 A | 7/1997 | Endo et al. |
| 5,673,223 A | 9/1997 | Park |
| 5,707,487 A | 1/1998 | Hori et al. |
| 5,714,416 A | 2/1998 | Eichman et al. |
| 5,751,012 A | 5/1998 | Wolstenholme et al. |
| 5,763,898 A | 6/1998 | Forouhi et al. |
| 5,840,608 A | 11/1998 | Chang |
| 5,923,587 A | 7/1999 | Choi |
| 5,970,332 A | 10/1999 | Pruijmboom et al. |
| 5,973,335 A | 10/1999 | Shannon |
| 5,998,244 A | 12/1999 | Wolstenholme et al. |
| 6,002,268 A | 12/1999 | Sasaki et al. |
| 6,037,204 A | 3/2000 | Chang et al. |
| 6,122,318 A | 9/2000 | Yamaguchi et al. |
| 6,128,214 A | 10/2000 | Kuekes et al. |
| 6,143,642 A | 11/2000 | Sur, Jr. et al. |
| 6,180,998 B1 | 1/2001 | Crafts |
| 6,181,587 B1 | 1/2001 | Kuramoto et al. |
| 6,181,597 B1 | 1/2001 | Nachumovsky |
| 6,259,116 B1 | 7/2001 | Shannon |
| 6,288,435 B1 | 9/2001 | Mei et al. |
| 6,291,836 B1 | 9/2001 | Kramer et al. |
| 6,436,765 B1 | 8/2002 | Liou et al. |
| 6,436,818 B1 | 8/2002 | Hu et al. |
| 6,492,694 B2 | 12/2002 | Noble et al. |
| 6,511,862 B2 | 1/2003 | Hudgens et al. |
| 6,552,932 B1 | 4/2003 | Cernea |
| 6,627,530 B2 | 9/2003 | Li et al. |
| 6,724,186 B2 | 4/2004 | Jordil |
| 6,731,535 B1 | 5/2004 | Ooishi et al. |
| 6,740,921 B2 | 5/2004 | Matsuoka et al. |
| 6,762,474 B1 | 7/2004 | Mills, Jr. |
| 6,768,157 B2 | 7/2004 | Krieger et al. |
| 6,815,286 B2 | 11/2004 | Krieger et al. |
| 6,816,405 B1 | 11/2004 | Lu et al. |
| 6,821,879 B2 | 11/2004 | Wong |
| 6,838,720 B2 | 1/2005 | Krieger et al. |
| 6,848,012 B2 | 1/2005 | LeBlanc et al. |
| 6,849,891 B1 | 2/2005 | Hsu et al. |
| 6,858,481 B2 | 2/2005 | Krieger et al. |
| 6,858,482 B2 | 2/2005 | Gilton |
| 6,864,127 B2 | 3/2005 | Yamazaki et al. |
| 6,864,522 B2 | 3/2005 | Krieger et al. |
| 6,867,618 B2 | 3/2005 | Li |
| 6,881,994 B2 | 4/2005 | Lee et al. |
| 6,897,519 B1 | 5/2005 | Dosluoglu |
| 6,927,430 B2 | 8/2005 | Hsu |
| 6,939,787 B2 | 9/2005 | Ohtake et al. |
| 6,946,719 B2 | 9/2005 | Petti et al. |
| 7,020,006 B2 | 3/2006 | Chevallier et al. |
| 7,023,093 B2 | 4/2006 | Canaperi et al. |
| 7,026,702 B2 | 4/2006 | Krieger et al. |
| 7,087,454 B2 | 8/2006 | Campbell et al. |
| 7,102,150 B2 | 9/2006 | Harshfield et al. |
| 7,122,853 B1 | 10/2006 | Gaun et al. |
| 7,167,387 B2 | 1/2007 | Sugita et al. |
| 7,187,577 B1 | 3/2007 | Wang et al. |
| 7,221,599 B1 | 5/2007 | Gaun et al. |
| 7,238,607 B2 | 7/2007 | Dunton et al. |
| 7,238,994 B2 | 7/2007 | Chen et al. |
| 7,251,152 B2 | 7/2007 | Roehr |
| 7,254,053 B2 | 8/2007 | Krieger et al. |
| 7,274,587 B2 | 9/2007 | Yasuda |
| 7,289,353 B2 | 10/2007 | Spitzer et al. |
| 7,324,363 B2 | 1/2008 | Kerns et al. |
| 7,345,907 B2 | 3/2008 | Scheuerlein |
| 7,365,411 B2 | 4/2008 | Campbell |
| 7,405,418 B2 | 7/2008 | Happ et al. |
| 7,426,128 B2 | 9/2008 | Scheuerlein |
| 7,433,253 B2 | 10/2008 | Gogl et al. |
| 7,474,000 B2 | 1/2009 | Scheuerlein et al. |
| 7,479,650 B2 | 1/2009 | Gilton |
| 7,499,355 B2 | 3/2009 | Scheuerlein et al. |
| 7,515,454 B2 | 4/2009 | Symanczyk |
| 7,521,705 B2 | 4/2009 | Liu |
| 7,534,625 B2 | 5/2009 | Karpov et al. |
| 7,541,252 B2 | 6/2009 | Eun et al. |
| 7,550,380 B2 | 6/2009 | Elkins et al. |
| 7,561,461 B2 | 7/2009 | Nagai et al. |
| 7,566,643 B2 | 7/2009 | Czubatyi et al. |
| 7,571,012 B2 | 8/2009 | Gibson |
| 7,606,059 B2 | 10/2009 | Toda |
| 7,615,439 B1 | 11/2009 | Schricker et al. |
| 7,629,198 B2 | 12/2009 | Kumar et al. |
| 7,667,442 B2 | 2/2010 | Itoh |
| 7,692,959 B2 | 4/2010 | Krusin-Elbaum et al. |
| 7,704,788 B2 * | 4/2010 | Youn ................ H01L 27/2409 |
| | | 257/2 |
| 7,719,001 B2 | 5/2010 | Nomura et al. |
| 7,728,318 B2 | 6/2010 | Raghuram et al. |
| 7,729,158 B2 | 6/2010 | Toda et al. |
| 7,746,601 B2 | 6/2010 | Sugiyama et al. |
| 7,746,696 B1 | 6/2010 | Paak |
| 7,749,805 B2 | 7/2010 | Pinnow et al. |
| 7,764,536 B2 | 7/2010 | Luo et al. |
| 7,772,581 B2 | 8/2010 | Lung |
| 7,776,682 B1 | 8/2010 | Nickel et al. |
| 7,778,063 B2 | 8/2010 | Brubaker et al. |
| 7,786,464 B2 | 8/2010 | Nirschl et al. |
| 7,786,589 B2 | 8/2010 | Matsunaga et al. |
| 7,791,060 B2 | 9/2010 | Aochi et al. |
| 7,824,956 B2 | 11/2010 | Schricker et al. |
| 7,829,875 B2 | 11/2010 | Scheuerlein |
| 7,830,698 B2 | 11/2010 | Chen et al. |
| 7,835,170 B2 | 11/2010 | Bertin et al. |
| 7,858,468 B2 | 12/2010 | Liu et al. |
| 7,859,884 B2 | 12/2010 | Scheuerlein |
| 7,869,253 B2 | 1/2011 | Liaw et al. |
| 7,875,871 B2 | 1/2011 | Kumar et al. |
| 7,881,097 B2 | 2/2011 | Hosomi et al. |
| 7,883,964 B2 | 2/2011 | Goda et al. |
| 7,897,953 B2 | 3/2011 | Liu |
| 7,898,838 B2 | 3/2011 | Chen et al. |
| 7,920,412 B2 | 4/2011 | Hosotani et al. |
| 7,924,138 B2 | 4/2011 | Kinoshita et al. |
| 7,927,472 B2 | 4/2011 | Takahashi et al. |
| 7,968,419 B2 | 6/2011 | Li et al. |
| 7,972,897 B2 | 7/2011 | Kumar et al. |
| 7,984,776 B2 | 7/2011 | Sastry et al. |
| 8,004,882 B2 | 8/2011 | Katti et al. |
| 8,018,760 B2 | 9/2011 | Muraoka et al. |
| 8,021,897 B2 | 9/2011 | Sills et al. |
| 8,045,364 B2 | 10/2011 | Schloss et al. |
| 8,054,674 B2 | 11/2011 | Tamai et al. |
| 8,054,679 B2 | 11/2011 | Nakai et al. |
| 8,067,815 B2 | 11/2011 | Chien et al. |
| 8,071,972 B2 | 12/2011 | Lu et al. |
| 8,084,830 B2 | 12/2011 | Kanno et al. |
| 8,088,688 B1 | 1/2012 | Herner |
| 8,097,874 B2 | 1/2012 | Venkatasamy et al. |
| 8,102,018 B2 | 1/2012 | Bertin et al. |
| 8,102,698 B2 | 1/2012 | Scheuerlein |
| 8,143,092 B2 | 3/2012 | Kumar et al. |
| 8,144,498 B2 | 3/2012 | Kumar et al. |
| 8,164,948 B2 | 4/2012 | Katti et al. |
| 8,168,506 B2 | 5/2012 | Herner |

(56) References Cited

U.S. PATENT DOCUMENTS

| | | | |
|---|---|---|---|
| 8,183,553 B2 | 5/2012 | Phatak et al. | |
| 8,187,945 B2 | 5/2012 | Herner | |
| 8,198,144 B2 | 6/2012 | Herner | |
| 8,207,064 B2 | 6/2012 | Bandyopadhyay et al. | |
| 8,227,787 B2 | 7/2012 | Kumar et al. | |
| 8,231,998 B2 | 7/2012 | Sastry et al. | |
| 8,233,308 B2 | 7/2012 | Schricker et al. | |
| 8,237,146 B2 | 8/2012 | Kreupl et al. | |
| 8,243,542 B2 | 8/2012 | Bae et al. | |
| 8,258,020 B2 | 9/2012 | Herner | |
| 8,265,136 B2 | 9/2012 | Hong et al. | |
| 8,274,130 B2 | 9/2012 | Mihnea et al. | |
| 8,274,812 B2 | 9/2012 | Nazarian et al. | |
| 8,305,793 B2 | 11/2012 | Majewski et al. | |
| 8,315,079 B2 | 11/2012 | Kuo et al. | |
| 8,320,160 B2 | 11/2012 | Nazarian | |
| 8,351,241 B2 | 1/2013 | Lu et al. | |
| 8,369,129 B2 | 2/2013 | Fujita et al. | |
| 8,369,139 B2 | 2/2013 | Liu et al. | |
| 8,374,018 B2 | 2/2013 | Lu | |
| 8,385,100 B2 | 2/2013 | Kau et al. | |
| 8,389,971 B2 | 3/2013 | Chen et al. | |
| 8,394,670 B2 | 3/2013 | Herner | |
| 8,399,307 B2 | 3/2013 | Herner | |
| 8,441,835 B2 | 5/2013 | Jo et al. | |
| 8,456,892 B2 | 6/2013 | Yasuda | |
| 8,466,005 B2 | 6/2013 | Pramanik et al. | |
| 8,467,226 B2 | 6/2013 | Bedeschi et al. | |
| 8,467,227 B1 | 6/2013 | Jo | |
| 8,502,185 B2 | 8/2013 | Lu et al. | |
| 8,569,104 B2 | 10/2013 | Pham et al. | |
| 8,587,989 B2 | 11/2013 | Manning et al. | |
| 8,619,459 B1 | 12/2013 | Nguyen et al. | |
| 8,658,476 B1 | 2/2014 | Sun et al. | |
| 8,659,003 B2 | 2/2014 | Herner et al. | |
| 8,675,384 B2 | 3/2014 | Kuo et al. | |
| 8,693,241 B2 | 4/2014 | Kim et al. | |
| 8,853,759 B2 | 10/2014 | Lee et al. | |
| 8,934,294 B2 | 1/2015 | Kim et al. | |
| 8,946,667 B1 | 2/2015 | Clark et al. | |
| 8,946,673 B1 | 2/2015 | Kumar | |
| 8,947,908 B2 | 2/2015 | Jo | |
| 8,999,811 B2 | 4/2015 | Endo et al. | |
| 9,093,635 B2 | 7/2015 | Kim et al. | |
| 9,166,163 B2 | 10/2015 | Gee et al. | |
| 2002/0048940 A1 | 4/2002 | Derderian et al. | |
| 2003/0006440 A1 | 1/2003 | Uchiyama | |
| 2003/0036238 A1 | 2/2003 | Toet et al. | |
| 2003/0052330 A1 | 3/2003 | Klein | |
| 2003/0141565 A1 | 7/2003 | Hirose et al. | |
| 2003/0174574 A1 | 9/2003 | Perner et al. | |
| 2003/0194865 A1 | 10/2003 | Gilton | |
| 2003/0206659 A1 | 11/2003 | Hamanaka | |
| 2004/0026682 A1 | 2/2004 | Jiang | |
| 2004/0036124 A1 | 2/2004 | Vyvoda et al. | |
| 2004/0159835 A1 | 8/2004 | Krieger et al. | |
| 2004/0170040 A1 | 9/2004 | Rinerson et al. | |
| 2004/0192006 A1 | 9/2004 | Campbell et al. | |
| 2004/0194340 A1 | 10/2004 | Kobayashi | |
| 2004/0202041 A1 | 10/2004 | Hidenori | |
| 2005/0019699 A1 | 1/2005 | Moore | |
| 2005/0020510 A1 | 1/2005 | Benedict | |
| 2005/0029587 A1 | 2/2005 | Harshfield | |
| 2005/0041498 A1 | 2/2005 | Resta et al. | |
| 2005/0052915 A1 | 3/2005 | Herner et al. | |
| 2005/0062045 A1 | 3/2005 | Bhattacharyya | |
| 2005/0073881 A1 | 4/2005 | Tran et al. | |
| 2005/0101081 A1 | 5/2005 | Goda et al. | |
| 2005/0162881 A1 | 7/2005 | Stasiak et al. | |
| 2005/0175099 A1 | 8/2005 | Sarkijarvi et al. | |
| 2006/0017488 A1 | 1/2006 | Hsu et al. | |
| 2006/0054950 A1* | 3/2006 | Baek | H01L 27/112 257/295 |
| 2006/0134837 A1 | 6/2006 | Subramanian et al. | |
| 2006/0154417 A1* | 7/2006 | Shinmura | H01L 27/2463 438/240 |
| 2006/0215445 A1 | 9/2006 | Baek et al. | |
| 2006/0231910 A1 | 10/2006 | Hsieh et al. | |
| 2006/0246606 A1 | 11/2006 | Hsu et al. | |
| 2006/0279979 A1 | 12/2006 | Lowrey et al. | |
| 2006/0281244 A1 | 12/2006 | Ichige et al. | |
| 2006/0286762 A1 | 12/2006 | Tseng et al. | |
| 2007/0008773 A1 | 1/2007 | Scheuerlein | |
| 2007/0015348 A1 | 1/2007 | Hsu et al. | |
| 2007/0025144 A1 | 2/2007 | Hsu et al. | |
| 2007/0035990 A1 | 2/2007 | Hush | |
| 2007/0042612 A1 | 2/2007 | Nishino et al. | |
| 2007/0045615 A1 | 3/2007 | Cho et al. | |
| 2007/0069119 A1 | 3/2007 | Appleyard et al. | |
| 2007/0087508 A1 | 4/2007 | Herner et al. | |
| 2007/0090425 A1 | 4/2007 | Kumar et al. | |
| 2007/0091685 A1 | 4/2007 | Guterman et al. | |
| 2007/0105284 A1 | 5/2007 | Herner et al. | |
| 2007/0105390 A1 | 5/2007 | Oh | |
| 2007/0133250 A1 | 6/2007 | Kim | |
| 2007/0133270 A1 | 6/2007 | Jeong et al. | |
| 2007/0159869 A1 | 7/2007 | Baek et al. | |
| 2007/0159876 A1 | 7/2007 | Sugibayashi et al. | |
| 2007/0171698 A1 | 7/2007 | Hoenigschmid et al. | |
| 2007/0205510 A1 | 9/2007 | Lavoie et al. | |
| 2007/0228414 A1 | 10/2007 | Kumar et al. | |
| 2007/0284575 A1 | 12/2007 | Li et al. | |
| 2007/0290186 A1 | 12/2007 | Bourim et al. | |
| 2007/0291527 A1 | 12/2007 | Tsushima et al. | |
| 2007/0295950 A1 | 12/2007 | Cho et al. | |
| 2007/0297501 A1 | 12/2007 | Hussain et al. | |
| 2008/0002481 A1 | 1/2008 | Gogl et al. | |
| 2008/0006907 A1 | 1/2008 | Lee et al. | |
| 2008/0007987 A1 | 1/2008 | Takashima | |
| 2008/0019163 A1 | 1/2008 | Hoenigschmid et al. | |
| 2008/0043521 A1 | 2/2008 | Liaw et al. | |
| 2008/0048164 A1 | 2/2008 | Odagawa | |
| 2008/0083918 A1 | 4/2008 | Aratani et al. | |
| 2008/0089110 A1 | 4/2008 | Robinett et al. | |
| 2008/0090337 A1 | 4/2008 | Williams | |
| 2008/0106925 A1 | 5/2008 | Paz de Araujo et al. | |
| 2008/0106926 A1 | 5/2008 | Brubaker et al. | |
| 2008/0165571 A1 | 7/2008 | Lung | |
| 2008/0185567 A1 | 8/2008 | Kumar et al. | |
| 2008/0192531 A1 | 8/2008 | Tamura et al. | |
| 2008/0198934 A1 | 8/2008 | Hong et al. | |
| 2008/0205179 A1 | 8/2008 | Markert et al. | |
| 2008/0206931 A1 | 8/2008 | Breuil et al. | |
| 2008/0220601 A1 | 9/2008 | Kumar et al. | |
| 2008/0232160 A1 | 9/2008 | Gopalakrishnan | |
| 2008/0278988 A1 | 11/2008 | Ufert | |
| 2008/0278990 A1 | 11/2008 | Kumar et al. | |
| 2008/0301497 A1 | 12/2008 | Chung et al. | |
| 2008/0304312 A1 | 12/2008 | Ho et al. | |
| 2008/0311722 A1 | 12/2008 | Petti et al. | |
| 2009/0001343 A1 | 1/2009 | Schricker et al. | |
| 2009/0001345 A1 | 1/2009 | Schricker et al. | |
| 2009/0003717 A1 | 1/2009 | Sekiguchi et al. | |
| 2009/0014703 A1 | 1/2009 | Inaba | |
| 2009/0014707 A1 | 1/2009 | Lu et al. | |
| 2009/0052226 A1 | 2/2009 | Lee et al. | |
| 2009/0091981 A1 | 4/2009 | Park et al. | |
| 2009/0095951 A1 | 4/2009 | Kostylev et al. | |
| 2009/0109728 A1 | 4/2009 | Maejima et al. | |
| 2009/0122591 A1 | 5/2009 | Ryu | |
| 2009/0134432 A1 | 5/2009 | Tabata et al. | |
| 2009/0141567 A1 | 6/2009 | Lee et al. | |
| 2009/0152737 A1 | 6/2009 | Harshfield | |
| 2009/0168486 A1 | 7/2009 | Kumar | |
| 2009/0227067 A1 | 9/2009 | Kumar et al. | |
| 2009/0231905 A1 | 9/2009 | Sato | |
| 2009/0231910 A1 | 9/2009 | Liu et al. | |
| 2009/0250787 A1 | 10/2009 | Kutsunai | |
| 2009/0251941 A1 | 10/2009 | Saito | |
| 2009/0256130 A1 | 10/2009 | Schricker | |
| 2009/0257265 A1 | 10/2009 | Chen et al. | |
| 2009/0267047 A1 | 10/2009 | Sasago et al. | |
| 2009/0268513 A1 | 10/2009 | De Ambroggi et al. | |

(56) References Cited

U.S. PATENT DOCUMENTS

| | | |
|---|---|---|
| 2009/0272962 A1 | 11/2009 | Kumar et al. |
| 2009/0283737 A1 | 11/2009 | Kiyotoshi |
| 2009/0298224 A1 | 12/2009 | Lowrey |
| 2009/0309087 A1* | 12/2009 | Lung .................. H01L 27/2409 257/2 |
| 2009/0321706 A1 | 12/2009 | Happ et al. |
| 2009/0321789 A1 | 12/2009 | Wang et al. |
| 2010/0007937 A1 | 1/2010 | Widjaja et al. |
| 2010/0012914 A1 | 1/2010 | Xu et al. |
| 2010/0019221 A1 | 1/2010 | Lung et al. |
| 2010/0019310 A1 | 1/2010 | Sakamoto |
| 2010/0025675 A1 | 2/2010 | Yamazaki et al. |
| 2010/0032637 A1 | 2/2010 | Kinoshita et al. |
| 2010/0032638 A1 | 2/2010 | Xu |
| 2010/0032640 A1 | 2/2010 | Xu |
| 2010/0034518 A1 | 2/2010 | Iwamoto et al. |
| 2010/0038791 A1 | 2/2010 | Lee et al. |
| 2010/0039136 A1 | 2/2010 | Chua-Eoan et al. |
| 2010/0044708 A1 | 2/2010 | Lin et al. |
| 2010/0044798 A1 | 2/2010 | Hooker et al. |
| 2010/0046622 A1 | 2/2010 | Doser et al. |
| 2010/0067279 A1 | 3/2010 | Choi |
| 2010/0067282 A1 | 3/2010 | Liu et al. |
| 2010/0084625 A1 | 4/2010 | Wicker et al. |
| 2010/0085798 A1 | 4/2010 | Lu et al. |
| 2010/0085822 A1 | 4/2010 | Yan et al. |
| 2010/0090192 A1* | 4/2010 | Goux ...................... B82Y 10/00 257/4 |
| 2010/0101290 A1 | 4/2010 | Bertolotto |
| 2010/0102290 A1 | 4/2010 | Lu et al. |
| 2010/0110767 A1 | 5/2010 | Katoh et al. |
| 2010/0118587 A1 | 5/2010 | Chen et al. |
| 2010/0140614 A1 | 6/2010 | Uchiyama et al. |
| 2010/0155784 A1 | 6/2010 | Scheuerlein |
| 2010/0157651 A1 | 6/2010 | Kumar et al. |
| 2010/0157656 A1 | 6/2010 | Tsuchida |
| 2010/0157659 A1 | 6/2010 | Norman |
| 2010/0157710 A1 | 6/2010 | Lambertson et al. |
| 2010/0163828 A1 | 7/2010 | Tu |
| 2010/0171086 A1 | 7/2010 | Lung et al. |
| 2010/0176367 A1 | 7/2010 | Liu |
| 2010/0176368 A1 | 7/2010 | Ko et al. |
| 2010/0182821 A1 | 7/2010 | Muraoka et al. |
| 2010/0203731 A1 | 8/2010 | Kong et al. |
| 2010/0219510 A1 | 9/2010 | Scheuerlein et al. |
| 2010/0221868 A1 | 9/2010 | Sandoval |
| 2010/0237314 A1 | 9/2010 | Tsukamoto et al. |
| 2010/0243983 A1 | 9/2010 | Chiang et al. |
| 2010/0258781 A1 | 10/2010 | Phatak et al. |
| 2010/0271885 A1 | 10/2010 | Scheuerlein et al. |
| 2010/0277969 A1 | 11/2010 | Li et al. |
| 2010/0321095 A1 | 12/2010 | Mikawa et al. |
| 2011/0006275 A1 | 1/2011 | Roelofs et al. |
| 2011/0007551 A1 | 1/2011 | Tian et al. |
| 2011/0033967 A1 | 2/2011 | Lutz et al. |
| 2011/0063888 A1 | 3/2011 | Chi et al. |
| 2011/0066878 A1 | 3/2011 | Hosono et al. |
| 2011/0068373 A1 | 3/2011 | Minemura et al. |
| 2011/0069533 A1 | 3/2011 | Kurosawa et al. |
| 2011/0089391 A1 | 4/2011 | Mihnea et al. |
| 2011/0122679 A1 | 5/2011 | Chen et al. |
| 2011/0128779 A1 | 6/2011 | Redaelli et al. |
| 2011/0133149 A1 | 6/2011 | Sonehara |
| 2011/0136327 A1 | 6/2011 | Han et al. |
| 2011/0151277 A1 | 6/2011 | Nishihara et al. |
| 2011/0155991 A1 | 6/2011 | Chen |
| 2011/0183525 A1 | 7/2011 | Purushothaman et al. |
| 2011/0193051 A1 | 8/2011 | Nam et al. |
| 2011/0194329 A1 | 8/2011 | Ohba et al. |
| 2011/0198557 A1 | 8/2011 | Rajendran et al. |
| 2011/0204312 A1 | 8/2011 | Phatak |
| 2011/0204314 A1 | 8/2011 | Baek et al. |
| 2011/0205780 A1 | 8/2011 | Yasuda et al. |
| 2011/0205782 A1 | 8/2011 | Costa et al. |
| 2011/0212616 A1 | 9/2011 | Seidel et al. |
| 2011/0227028 A1 | 9/2011 | Sekar et al. |
| 2011/0284814 A1 | 11/2011 | Zhang |
| 2011/0299324 A1 | 12/2011 | Li et al. |
| 2011/0305064 A1 | 12/2011 | Jo et al. |
| 2011/0310656 A1 | 12/2011 | Kreupl et al. |
| 2011/0312151 A1 | 12/2011 | Herner |
| 2011/0317470 A1 | 12/2011 | Lu et al. |
| 2012/0001145 A1 | 1/2012 | Magistretti et al. |
| 2012/0001146 A1 | 1/2012 | Lu et al. |
| 2012/0007035 A1 | 1/2012 | Jo et al. |
| 2012/0008366 A1* | 1/2012 | Lu ........................ G11C 13/0002 365/148 |
| 2012/0012806 A1 | 1/2012 | Herner |
| 2012/0012808 A1 | 1/2012 | Herner |
| 2012/0015506 A1 | 1/2012 | Jo et al. |
| 2012/0025161 A1 | 2/2012 | Rathor et al. |
| 2012/0033479 A1 | 2/2012 | DeLucca et al. |
| 2012/0043519 A1 | 2/2012 | Jo et al. |
| 2012/0043520 A1 | 2/2012 | Herner et al. |
| 2012/0043621 A1 | 2/2012 | Herner |
| 2012/0043654 A1 | 2/2012 | Lu et al. |
| 2012/0044751 A1 | 2/2012 | Wang et al. |
| 2012/0074374 A1 | 3/2012 | Jo |
| 2012/0074507 A1 | 3/2012 | Jo et al. |
| 2012/0076203 A1 | 3/2012 | Sugimoto et al. |
| 2012/0080798 A1 | 4/2012 | Harshfield |
| 2012/0087169 A1 | 4/2012 | Kuo et al. |
| 2012/0087172 A1 | 4/2012 | Aoki |
| 2012/0091420 A1 | 4/2012 | Kusai et al. |
| 2012/0104351 A1 | 5/2012 | Wei et al. |
| 2012/0108030 A1 | 5/2012 | Herner |
| 2012/0120712 A1 | 5/2012 | Kawai et al. |
| 2012/0122290 A1 | 5/2012 | Nagashima |
| 2012/0140816 A1 | 6/2012 | Franche et al. |
| 2012/0142163 A1 | 6/2012 | Herner |
| 2012/0145984 A1 | 6/2012 | Rabkin et al. |
| 2012/0147657 A1 | 6/2012 | Sekar et al. |
| 2012/0155146 A1 | 6/2012 | Ueda et al. |
| 2012/0176831 A1 | 7/2012 | Xiao et al. |
| 2012/0205606 A1 | 8/2012 | Lee et al. |
| 2012/0205793 A1 | 8/2012 | Schieffer et al. |
| 2012/0218807 A1 | 8/2012 | Johnson |
| 2012/0220100 A1 | 8/2012 | Herner |
| 2012/0224413 A1 | 9/2012 | Zhang et al. |
| 2012/0235112 A1 | 9/2012 | Huo et al. |
| 2012/0236625 A1 | 9/2012 | Ohba et al. |
| 2012/0241710 A1 | 9/2012 | Liu et al. |
| 2012/0243292 A1 | 9/2012 | Takashima et al. |
| 2012/0250183 A1 | 10/2012 | Tamaoka et al. |
| 2012/0250395 A1 | 10/2012 | Nodin |
| 2012/0252183 A1 | 10/2012 | Herner |
| 2012/0269275 A1 | 10/2012 | Hannuksela |
| 2012/0305874 A1 | 12/2012 | Herner |
| 2012/0305879 A1 | 12/2012 | Lu et al. |
| 2012/0320660 A1 | 12/2012 | Nazarian et al. |
| 2012/0326265 A1 | 12/2012 | Lai et al. |
| 2012/0327701 A1 | 12/2012 | Nazarian |
| 2013/0020548 A1 | 1/2013 | Clark et al. |
| 2013/0023085 A1 | 1/2013 | Pramanik et al. |
| 2013/0026440 A1 | 1/2013 | Yang et al. |
| 2013/0065066 A1 | 3/2013 | Sambasivan et al. |
| 2013/0075685 A1 | 3/2013 | Li et al. |
| 2013/0075688 A1* | 3/2013 | Xu ......................... H01L 45/06 257/4 |
| 2013/0119341 A1 | 5/2013 | Liu et al. |
| 2013/0128653 A1 | 5/2013 | Kang et al. |
| 2013/0134379 A1 | 5/2013 | Lu |
| 2013/0166825 A1 | 6/2013 | Kim et al. |
| 2013/0207065 A1 | 8/2013 | Chiang |
| 2013/0214234 A1 | 8/2013 | Gopalan et al. |
| 2013/0235648 A1 | 9/2013 | Kim et al. |
| 2013/0264535 A1 | 10/2013 | Sonehara |
| 2013/0279240 A1 | 10/2013 | Jo |
| 2013/0308369 A1 | 11/2013 | Lu et al. |
| 2014/0015018 A1 | 1/2014 | Kim |
| 2014/0029327 A1 | 1/2014 | Strachan et al. |
| 2014/0070160 A1 | 3/2014 | Ishikawa et al. |
| 2014/0103284 A1 | 4/2014 | Hsueh et al. |
| 2014/0145135 A1 | 5/2014 | Gee et al. |

(56) References Cited

U.S. PATENT DOCUMENTS

| | | | |
|---|---|---|---|
| 2014/0166961 A1* | 6/2014 | Liao | H01L 45/1253 257/4 |
| 2014/0175360 A1 | 6/2014 | Tendulkar et al. | |
| 2014/0177315 A1 | 6/2014 | Pramanik et al. | |
| 2014/0192589 A1 | 7/2014 | Maxwell et al. | |
| 2014/0197369 A1 | 7/2014 | Sheng et al. | |
| 2014/0233294 A1 | 8/2014 | Ting et al. | |
| 2014/0264236 A1 | 9/2014 | Kim et al. | |
| 2014/0264250 A1 | 9/2014 | Maxwell et al. | |
| 2014/0268997 A1 | 9/2014 | Nazarian et al. | |
| 2014/0268998 A1 | 9/2014 | Jo | |
| 2014/0269002 A1 | 9/2014 | Jo | |
| 2014/0312296 A1 | 10/2014 | Jo et al. | |
| 2014/0335675 A1 | 11/2014 | Narayanan | |
| 2015/0070961 A1 | 3/2015 | Katayama et al. | |
| 2015/0228334 A1 | 8/2015 | Nazarian et al. | |
| 2016/0111640 A1 | 4/2016 | Chang et al. | |

FOREIGN PATENT DOCUMENTS

| | | |
|---|---|---|
| CN | 101501850 A | 8/2009 |
| CN | 101636792 A | 1/2010 |
| CN | 102024494 A | 4/2011 |
| CN | 102077296 A | 5/2011 |
| EP | 1096465 A2 | 5/2001 |
| EP | 2405551 A1 | 1/2012 |
| EP | 2408035 A2 | 1/2012 |
| JP | 2005506703 A | 3/2005 |
| JP | 2006032951 A | 2/2006 |
| JP | 2007067408 A | 3/2007 |
| JP | 2007281208 A | 10/2007 |
| JP | 2007328857 A | 12/2007 |
| JP | 2008503085 A | 1/2008 |
| JP | 2008147343 A | 6/2008 |
| JP | 2009043873 A | 2/2009 |
| JP | 2011023645 A | 2/2011 |
| JP | 2011065737 A | 3/2011 |
| JP | 2012504840 A | 2/2012 |
| JP | 2012505551 A | 3/2012 |
| JP | 2012089567 A | 5/2012 |
| JP | 2012533195 A | 12/2012 |
| KR | 20090051206 A | 5/2009 |
| KR | 20110014248 A | 2/2011 |
| TW | 382820 B | 2/2000 |
| TW | 434887 B | 5/2001 |
| TW | 476962 B | 2/2002 |
| TW | 200625635 A | 7/2006 |
| WO | 03034498 A1 | 4/2003 |
| WO | 2005124787 A2 | 12/2005 |
| WO | 2009005699 A1 | 1/2009 |
| WO | 2010026654 A1 | 3/2010 |
| WO | 2010042354 A1 | 4/2010 |
| WO | 2010042732 A2 | 4/2010 |
| WO | 2011005266 A1 | 1/2011 |
| WO | 2011008654 A1 | 1/2011 |
| WO | 2011133138 A1 | 10/2011 |

OTHER PUBLICATIONS

Avila A., et al., "Switching in Coplanar Amorphous Hydrogenated Silicon Devices," Solid-State Electronics, 2000, vol. 44 (1), pp. 17-27.
Cagli C., et al., "Evidence for Threshold Switching in the Set Process of Nio-based Rram and Physical Modeling for Set, Reset, Retention and Disturb Prediction", 2008 IEEE International Electron Devices Meeting (IEDM), Dec. 15-17, 2008, pp. 1-4, San Francisco, CA, USA.
Chang P.H., at al., "Aluminum Spiking at Contact Windows in Al/Ti—W/Si," Applied Physics Letters, 1988, vol. 52 (4), pp. 272-274.
Chen Y., et al., "Nanoscale Molecular-switch Crossbar Circuits," Nanotechnology, 2003, vol. 14, pp. 462-468.
Chinese Office Action (English Translation) for Chinese Application No. 201180050941.0 dated Apr. 3, 2015, 8 pages.
Chinese Office Action (English Translation) for Chinese Application No. 201280027066.9 dated Nov. 23, 2015, 6 pages.
Chinese Office Action (English Translation) for Chinese Application No. 201110195933.7 dated Jul. 31, 2014, 4 pages.
Chinese Office Action (English Translation) for Chinese Application No. 201110195933.7 dated May 18, 2015, 4 pages.
Chinese Office Action (English Translation) for Chinese Application No. 201180050941.0 dated Dec. 9, 2015, 5 pages.
Chinese Office Action (with English Translation) for Chinese Application No. 201280027066.9 mailed on Jul. 4, 2016, 5 pages.
Chinese Office Action (with English Translation) for Chinese Application No. 201290000773.4 dated Jun. 9, 2014, 3 pages.
Chinese Seach Report (English Translation) for Chinese Application No. 201180050941.0 dated Mar. 25, 2015, 1 page.
Chinese Search Report (English Translation) for Chinese Application No. 201280027066.9 dated Nov. 13, 2015, 2 pages.
Choi J.W., "Bistable [2]Rotaxane Based Molecular Electronics: Fundamentals and Applications", Dissertation, Chapter 3, California Institute of Technology, Pasadena, 2007, pp. 79-120. Retrieved from the Internet:.
Chou S.Y., et al., "Imprint Lithography With 25-Nanometer Resolution," Science, 1996, vol. 272, pp. 85-87.
Collier C.P., et al., "Electronically Configurable Molecular-based Logic Gates ," Science, 1999, vol. 285 (5426), pp. 391-395.
Corrected Notice of Allowability dated Nov. 20, 2014 for U.S. Appl. No. 13/594,665, 5 pages.
Corrected Notice of Allowability dated Jun. 15, 2016 for U.S. Appl. No. 13/952,467, 10 pages.
Corrected Notice of Allowability mailed Oct. 1, 2013 for U.S. Appl. No. 13/733,828, filed Jan. 3, 2013.
Corrected Notice of Allowance mailed Jan. 11, 2013 for U.S. Appl. No. 12/861,666 dated Aug. 23, 2010.
Dehon A., "Array-Based Architecture for FET-Based, Nanoscale Electronics," IEEE Transactions on Nanotechnology, 2003, vol. 2 (1), pp. 23-32.
Del Alamo J., et al., "Operating limits of Al-alloyed High-low Junction for BSF Solar Cells," Solid-State Electronics, 1981, vol. 24, pp. 415-420.
Den Boer W., "Threshold Switching in Hydrogenated Amorphous Silicon," Applied Physics Letters, 1982, vol. 40, pp. 812-813.
Dey S.K., "Electrothermal Model of Switching in Amorphous Silicon Films," Journal of Vacuum Science & Technology , 1980, vol. 17 (1), pp. 445-448.
Dong Y., et al., "Si/a-Si Core/Shell Nanowires as Nonvolatile Crossbar Switches," Nano Letters, 2008, vol. 8 (2), pp. 386-391.
European Search Report for Application No. EP09819890.6 mailed on Mar. 27, 2012.
European Search Report for Application No. EP11005207.3 mailed on Oct. 12, 2011.
European Search Report for Application No. EP14000949, mailed on Jun. 4, 2014, 7 pages.
European Search Report for European Application No. EP11005649 mailed Oct. 15, 2014, 2 pages.
Ex parte Quayle Action mailed May 8, 2012 for U.S. Appl. No. 12/826,653, filed Jun. 29, 2010.
Final Office Action dated Jun. 29, 2016 for U.S. Appl. No. 14/692,677, 21 pages.
Final Office Action for U.S. Appl. No. 14/612,025 dated Jun. 14, 2016, 7 pages.
Final Office Action mailed Feb. 1, 2016 for U.S. Appl. No. 14/573,817.
Final Office Action mailed May 20, 2016 for U.S. Appl. No. 14/253,796.
Final Office Action mailed Aug. 13, 2014 for U.S. Appl. No. 13/525,096, filed Jun. 15, 2012.
Gangopadhyay S., et al., "Memory Switching in Sputtered Hydrogenated Amorphous Silicon (a-Si:H)," Japanese Journal of Applied Physics, 1985, vol. 24 (10), pp. 1363-1364.
Goronkin H., et al., High-Performance Emerging Solid-State Memory Technologies, MRS Bulletin, Nov. 2004, pp. 805-813. Retrieved from the Internet:.

(56) References Cited

OTHER PUBLICATIONS

Zankovych S., et al., "Nanoimprint Lithography: Challenges and Prospects," Nanotechnology, 2001, vol. 12, pp. 91-95.
Hajto J., et al., "Analogue Memory and Ballistic Electron Effects in Metal-amorphous Silicon Structures," Philosophical Magazine, 1991, vol. 63 (1), pp. 349-369.
Hajto J., et al., "Electronic Switching in Amorphous-Semiconductor Thin Films," Amorphous & Microcrystalline Semiconductor Devices: Materials and Device Physics, Chapter 14, 1992, pp. 640-701, vol. 2, Artech House, Inc.
Hajto J., et al., "The Programmability of Amorphous Silicon Analogue Memory Elements," Materials Research Society Symposium Proceedings, 1990, vol. 192, pp. 405-410.
Holmes A.J., et al., "Design of Analogue Synapse Circuits using Non-Volatile a-Si:H Memory Devices", pp. 351-354.
Hu J., et al., "AC Characteristics of Cr/p.sup.+a-Si:H/V Analog Switching Devices," IEEE Transactions on Electron Devices, 2000, vol. 47 (9), pp. 1751-1757.
Hu X.Y., et al., "Write Amplification Analysis in Flash-based Solid State Drives", SYSTOR'09; 20090504-20090406, May 4, 2009, pp. 1-9.
Hudgens S., et al., "Overview of Phase-Change Chalcogenide Nonvolatile Memory Technology", MRS Bulletin, Nov. 2004, pp. 829-832. Retrieved from the Internet:.
International Search Report and Written Opinion for Application No. PCT/US2011/040362, mailed on Jan. 19, 2012, 7 pages.
International Search Report and Written Opinion for Application No. PCT/US2011/046035, mailed on Mar. 27, 2012, 6 pages.
International Search Report and Written Opinion for Application No. PCT/US2012/040232, mailed on Feb. 26, 2013, 7 pages.
International Search Report and Written Opinion for Application No. PCT/US2012/040242, mailed on Jan. 31, 2013, 9 pages.
International Search Report and Written Opinion for Application No. PCT/US2012/044077, mailed on Jan. 25, 2013, 9 pages.
International Search Report and Written Opinion for Application No. PCT/US2012/045312, mailed on Mar. 29, 2013, 11 pages.
International Search Report and Written Opinion for Application No. PCT/US2013/042746, mailed on Sep. 6, 2013, 7 pages.
Iternational Search Report and Written Opinion for Application No. PCT/US2013/061244, mailed on Jan. 28, 2014, 8 pages.
International Search Report and Written Opinion for Application No. PCT/US2013/077628, mailed on Apr. 29, 2014, 12 pages.
International Search Report for Application No. PCT/US2009/060023, mailed on May 18, 2010, 3 pages.
International Search Report for Application No. PCT/US2009/061249, mailed on May 19, 2010, 3 pages.
International Search Report for Application No. PCT/US2011/040090, mailed on Feb. 17, 2012, 5 pages.
International Search Report for Application No. PCT/US2011/045124, mailed on May 29, 2012, 3 pages.
International Search Report for Application No. PCT/US2011/046036, mailed on Feb. 23, 2012, 4 pages.
Jafar M., et al., "Switching in Amorphous-silicon Devices," Physical Review, 1994, vol. 49 (19), pp. 611-615.
Nritten Opinion for Application No. PCT/US2011/046036, mailed on Feb. 23, 2012, 4 pages.
Notice of Allowance dated Aug. 28, 2015 for U.S. Appl. No. 14/573,770, 23 pages.
Japanese Office Action (English Translation) for Japanese Application No. 2011-153349 mailed Feb. 24, 2015, 3 pages.
Japanese Office Action (English Translation) for Japanese Application No. 2013-525926 mailed Mar. 3, 2015, 4 pages.
Japanese Office Action (English Translation) for Japanese Application No. 2014-513700 mailed Jan. 12, 2016, 4 pages.
Japanese Search Report (English Translation) for Japanese Application No. 2013-525926 dated Feb. 9, 2015, 15 pages.
Japanese Search Report (English Translation) for Japanese Application No. 2011-153349 dated Feb. 9, 2015, 11 pages.
Japanese Search Report (English Translation) for Japanese Application No. 2014-513700 dated Jan. 14, 2016, 25 pages.
Hu., et al., "Area-Dependent Switching in Thin Film-Silicon Devices," Materials Research Society Symposium Proceedings, 2003, vol. 762, pp. A 18.3.1-A 18.3.6.
Hu., et al. "Switching and Filament Formation in hot-wire CVD p-type a-Si:H devices," Thin Solid Films, Science Direct, 2003, vol. 430, pp. 249-252.
Jo S.H., et al., "A Silicon-Based Crossbar Ultra-High-Density Non-Volatile Memory", SSEL Annual Report, 2007.
Jo S.H., et al., "Ag/a-Si:H/c-Si Resistive Switching Nonvolatile Memory Devices," Nanotechnology Materials and Devices Conference, 2006, vol. 1, pp. 116-117.
Jo S.H., et al., "CMOS Compatible Nanoscale Nonvolatile Resistance Switching Memory," Nano Letters, 2008, vol. 8 (2), pp. 392-397.
Jo S.H., et al., "Experimental, Modeling and Simulation Studies of Nanoscale Resistance Switching Devices", 9.sup.th Conference on Nanotechnology, IEEE, 2009, pp. 493-495.
Jo S.H., et al., "High-Density Crossbar Arrays Based on a Si Memristive System," Nano Letters, 2009, vol. 9 (2), pp. 870-874.
Jo S.H. et al., "High-Density Crossbar Arrays Based on a Si Memristive System", Supporting Information, 2009, pp. 1-4.
Jo S.H., et al., "Si Memristive Devices Applied to Memory and Neuromorphic Circuits", Proceedings of 2010 IEEE International Symposium on Circuits and Systems, 2010, pp. 13-16.
Jo S.H., et al., "Si-Based Two-Terminal Resistive Switching Nonvolatile Memory", IEEE, 2008.
Jo S.H., et al., "Nanoscale Memristive Devices for Memory and Logic Applications", Ph. D Dissertation, University of Michigan, 2010.
Jo S.H., et al., "Nanoscale Memristor Device as Synapse in Neuromorphic Systems," Nano Letters, 2010, vol. 10, pp. 1297-1301.
Jo S.H., et al., "Nonvolatile Resistive Switching Devices Based on Nanoscale Metal/Amorphous Silicon/Crystalline Silicon Junctions," Materials Research Society Symposium Proceedings, 2007, vol. 997.
Jo S.H., et al., "Programmable Resistance Switching in Nanoscale Two-Terminal Devices," Nano Letters, 2009, vol. 9 (1), pp. 496-500.
Jo S.H., et al., "Programmable Resistance Switching in Nanoscale Two-Terminal Devices," Supporting Information, pp. 1-4.
Kuk-Hwan Kim et al., "Nanoscale Resistive Memory with Intrinsic Diode Characteristics and Long Endurance," Applied Physics Letters, 2010, vol. 96, pp. 053106-1-053106-3.
Kund M., et al., "Conductive Bridging Ram (cbram): An Emerging Non-volatile Memory Technology Scalable to Sub 20nm", IEEE, 2005.
Le Comber P.G., et al., "The Switching Mechanism in Amorphous Silicon Junctions," Journal of Non-Crystalline Solids, 1985, vol. 77 & 78, pp. 1373-1382.
Le Comber P.G., "Present and Future Applications of Amorphous Silicon and Its Alloys," Journal of Non-Crystalline Solids, 1989, vol. 115, pp. 1-13.
Lee S.H., et al., "Full Integration and Cell Characteristics for 64Mb Nonvolatile PRAM", 2004 Symposium on VLSI Technology Digest of Technical Papers, IEEE, 2004, pp. 20-21.
Liu M., et al., "rFGA: CMOS-Nano Hybrid FPGA Using RRAM Components", IEEE CB3 N17International Symposium on Nanoscale Architectures, Anaheim, USA, Jun. 12-13, 2008, pp. 93-98.
Lu W., et al., "Nanoelectronics from the Bottom Up," Nature Materials, 2007, vol. 6, pp. 841-850.
Lu W., et al., "Supporting Information", 2008.
Marand H., et al., MESc. 5025 lecture notes: Chapter 7. Diffusion, University of Vermont. Retrieved from the Internet:.
Moopenn A. et al., "Programmable Synaptic Devices for Electronic Neural Nets," Control and Computers, 1990, vol. 18 (2), pp. 37-41.
Muller D.A., et al., "The Electronic Structure at the Atomic Scale of Ultrathin Gate Oxides," Nature, 1999, vol. 399, pp. 758-761.
Muller G., et al., "Status and Outlook of Emerging Nonvolatile Memory Technologies", IEEE, 2004, pp. 567-570.
Newman R.C., "Defects in Silicon," Reports on Progress in Physics, 1982, vol. 45, pp. 1163-1210.

(56) References Cited

OTHER PUBLICATIONS

Notice of Allowance dated Nov. 26, 2013 for U.S. Appl. No. 13/481,696, 15 pages.
Notice of Allowance dated Dec. 16, 2014 for U.S. Appl. No. 12/835,704, 47 pages.
Notice of Allowance dated Dec. 19, 2014 for U.S. Appl. No. 13/529,985, 9 pgs.
Notice of Allowance dated Jul. 1, 2016 for U.S. Appl. No. 14/213,953, 96 pages.
Notice of Allowance dated Jul. 17, 2014 for U.S. Appl. No. 12/861,432, 25 pages.
Notice of Allowance for U.S. Appl. No. 14/213,953 dated Feb. 16, 2016, 21 pages.
Notice of Allowance for U.S. Appl. No. 14/611,022 dated Feb. 12, 2016, 13 pages.
Notice of Allowance for U.S. Appl. No. 14/611,022 dated Jun. 8, 2016, 57 pages.
Notice of Allowance for U.S. Appl. No. 14/611,022 dated Sep. 10, 2015, 13 pages.
Notice of Allowance for U.S. Appl. No. 14/612,025 dated Jul. 22, 2015, 25 pages.
Notice of Allowance for U.S. Appl. No. 14/509,967 dated Feb. 17, 2016, 18 pages.
Notice of Allowance for U.S. Appl. No. 14/509,967 dated Jun. 6, 2016, 96 pages.
Notice of Allowance for U.S. Appl. No. 13/912,136 dated Aug. 3, 2015, 15 pages.
Notice of Allowance for U.S. Appl. No. 13/952,467 dated May 20, 2016, 19 pages.
Notice of Allowance for U.S. Appl. No. 14/027,045 dated Jun. 9, 2015, 14 pages.
Notice of Allowance for U.S. Appl. No. 14/383,079 dated Jan. 4, 2016, 27 pages.
Notice of Allowance for U.S. Appl. No. 14/588,202 dated Jan. 20, 2016, 15 pages.
Notice of Allowance for U.S. Appl. No. 14/887,050 dated Jun. 22, 2016, 13 pages.
Notice of Allowance for U.S. Appl. No. 14/946,367 dated Jul. 13, 2016, 23 pages.
Notice of Allowance mailed Sep. 4, 2014 for U.S. Appl. No. 13/761,132, filed Feb. 6, 2013.
Notice of Allowance mailed Oct. 5, 2011 for U.S. Appl. No. 12/940,920, filed Nov. 5, 2010.
Notice of Allowance mailed Feb. 6, 2012 for U.S. Appl. No. 12/835,699, filed Jul. 13, 2010.
Notice of Allowance mailed Feb. 6, 2013 for U.S. Appl. No. 13/118,258, filed May 27, 2011.
Notice of Allowance mailed Aug. 8, 2013 for U.S. Appl. No. 13/733,828, filed Jan. 3, 2013.
Notice of Allowance mailed Jan. 8, 2013 for U.S. Appl. No. 12/814,410, filed Jun. 11, 2010.
Notice of Allowance mailed Oct. 8, 2013 for U.S. Appl. No. 13/769,152, filed Feb. 15, 2013.
Notice of Allowance mailed Oct. 8, 2013 for U.S. Appl. No. 13/905,074, filed May 29, 2013.
Notice of Allowance mailed Apr. 9, 2013 for U.S. Appl. No. 13/748,490, filed Jan. 23, 2013.
Notice of Allowance mailed Sep. 9, 2014 for U.S. Appl. No. 13/620,012, filed Sep. 14, 2012.
Notice of Allowance mailed Sep. 9, 2014 for U.S. Appl. No. 13/870,919, filed Apr. 25, 2013.
Notice of Allowance mailed Oct. 10, 2013 for U.S. Appl. No. 13/452,657, filed Apr. 20, 2012.
Notice of Allowance mailed Jan. 11, 2013 for U.S. Appl. No. 12/894,087, filed Sep. 29, 2010.
Notice of Allowance mailed May 11, 2012 for U.S. Appl. No. 12/939,824, filed Nov. 4, 2010.
Notice of Allowance mailed Jan. 11, 2016 for U.S. Appl. No. 14/613,299.
Notice of Allowance mailed Mar. 12, 2012 for U.S. Appl. No. 12/913,719, filed Oct. 27, 2010.
Notice of Allowance mailed Jan. 20, 2016 for U.S. Appl. No. 14/034,390.
Notice of Allowance mailed Nov. 13, 2013 for U.S. Appl. No. 13/461,725, filed May 1, 2012.
Notice of Allowance mailed Nov. 14, 2012 for U.S. Appl. No. 12/861,666, filed Aug. 23, 2010.
Notice of Allowance mailed Nov. 14, 2012 for U.S. Appl. No. 13/532,019, filed Jun. 25, 2012.
Notice of Allowance mailed Mar. 15, 2013 for U.S. Appl. No. 12/894,098, filed Sep. 29, 2010.
Notice of Allowance mailed Jan. 16, 2014 for U.S. Appl. No. 13/921,157, filed Jun. 18, 2013.
Notice of Allowance mailed Oct. 26, 2013 for U.S. Appl. No. 13/174,264, filed Jun. 30, 2011.
Notice of Allowance mailed Apr. 17, 2012 for U.S. Appl. No. 13/158,231, filed Jun. 10, 2011.
Notice of Allowance mailed Jan. 17, 2014 for U.S. Appl. No. 13/725,331, filed Dec. 21, 2012.
Notice of Allowance mailed Mar. 17, 2014 for U.S. Appl. No. 13/592,224, filed Aug. 22, 2012.
Notice of Allowance mailed May 17, 2013 for U.S. Appl. No. 13/290,024.
Notice of Allowance mailed Sep. 17, 2013 for U.S. Appl. No. 13/679,976, filed Nov. 16, 2012.
Notice of Allowance mailed Sep. 17, 2014 for U.S. Appl. No. 13/960,735, filed Aug. 6, 2013.
Notice of Allowance mailed Sep. 17, 2014 for U.S. Appl. No. 13/462,653, filed May 2, 2012.
Notice of Allowance mailed Sep. 18, 2012 for U.S. Appl. No. 12/900,232, filed Oct. 7, 2010.
Notice of Allowance mailed Sep. 18, 2014 for U.S. Appl. No. 13/920,021, filed Jun. 17, 2013.
Notice of Allowance mailed Sep. 18, 2014 for U.S. Appl. No. 13/586,815, filed Aug. 15, 2012.
Notice of Allowance mailed Jun. 19, 2012 for U.S. Appl. No. 12/861,650, filed Aug. 23, 2010.
Notice of Allowance mailed Apr. 2, 2013 for U.S. Appl. No. 13/149,757, filed May 31, 2011.
Notice of Allowance mailed Feb. 20, 2014 for U.S. Appl. No. 13/468,201, filed May 10, 2012.
Notice of Allowance mailed Mar. 20, 2014 for U.S. Appl. No. 13/598,550, filed Aug. 29, 2012.
Notice of Allowance mailed Mar. 20, 2014 for U.S. Appl. No. 13/461,725, filed May 1, 2012.
Notice of Allowance mailed Oct. 21, 2011 for U.S. Appl. No. 12/582,086, filed Oct. 20, 2009.
Notice of Allowance mailed Oct. 21, 2014 for U.S. Appl. No. 13/426,869, filed Mar. 22, 2012.
Notice of Allowance mailed Feb. 10, 2015 for U.S. Appl. No. 13/525,096, filed Jun. 15, 2012.
Notice of Allowance mailed May 22, 2012 for U.S. Appl. No. 12/815,369, filed Jun. 14, 2010.
Notice of Allowance mailed Dec. 23, 2015 for U.S. Appl. No. 14/573,770.
Notice of Allowance mailed Oct. 23, 2013 for U.S. Appl. No. 13/417,135, filed Mar. 9, 2012.
Notice of Allowance mailed Jan. 24, 2013 for U.S. Appl. No. 13/314,513, filed Dec. 8, 2011.
Notice of Allowance mailed Jul. 24, 2012 for U.S. Appl. No. 12/939,824, filed Nov. 4, 2010.
Notice of Allowance mailed Oct. 25, 2012 for U.S. Appl. No. 12/894,087, filed Sep. 29, 2010.
Notice of Allowance mailed Sep. 25, 2014 for U.S. Appl. No. 13/447,036, filed Apr. 13, 2012.
Notice of Allowance mailed Sep. 26, 2014 for U.S. Appl. No. 13/594,665, filed Aug. 24, 2012.
Notice of Allowance mailed Aug. 27, 2014 for U.S. Appl. No. 13/077,941, filed Mar. 31, 2011.
Notice of Allowance mailed Nov. 28, 2012 for U.S. Appl. No. 13/290,024, filed Nov. 4, 2011.

(56) References Cited

OTHER PUBLICATIONS

Notice of Allowance mailed Oct. 28, 2013 for U.S. Appl. No. 13/194,500, filed Jul. 29, 2011.
Notice of Allowance mailed Oct. 28, 2013 for U.S. Appl. No. 13/651,169, filed Oct. 12, 2012.
Notice of Allowance mailed Nov. 29, 2012 for U.S. Appl. No. 12/815,318, filed Jun. 14, 2010.
Notice of Allowance mailed Oct. 29, 2012 for U.S. Appl. No. 13/149,807, filed May 31, 2011.
Notice of Allowance mailed May 30, 2012 for U.S. Appl. No. 12/833,898, filed Jul. 9, 2010.
Notice of Allowance mailed Sep. 30, 2013 for U.S. Appl. No. 13/481,696, filed May 25, 2012.
Notice of Allowance mailed Aug. 31, 2012 for U.S. Appl. No. 13/051,296, filed Mar. 18, 2011.
Notice of Allowance mailed Apr. 20, 2016 for U.S. Appl. No. 14/573,817.
Notice of Allowance mailed Oct. 8, 2014 for U.S. Appl. No. 13/077,941, filed Mar. 31, 2011.
Notice of Allowance mailed Aug. 26, 2015 for U.S. Appl. No. 14/034,390.
Notice of Allowance mailed Sep. 8, 2015 for U.S. Appl. No. 14/613,299.
Office Action dated Dec. 31, 2015 for U.S. Appl. No. 14/692,677, 27 pages.
Office Action dated Feb. 5, 2015 for U.S. Appl. No. 14/027,045, 6 pages.
Office Action dated Apr. 11, 2014 for U.S. Appl. No. 13/594,665, 44 pages.
Yuan H.C., et al., "Silicon Solar Cells with Front Hetero-Contact and Aluminum Alloy Back Junction", NREL Conference Paper CP-520-42566, 33rd IEEE Photovoltaic Specialists Conference, May 11-16, 2008, National Renewable Energy Laboratory, San Diego, California.
Office Action for European Application No. 11005649.6 dated Dec. 1, 2014, 2 pages.
Office Action for European Application No. 11005649.6 dated Nov. 17, 2015, 5 pages.
Office Action for European Application No. EP11005207.3 dated Aug. 8, 2012, 4 pages.
Office Action mailed Jul. 12, 2012 for U.S. Appl. No. 13/463,714, filed May 3, 2012.
Office Action for U.S. Appl. No. 14/611,022 dated May 7, 2015, 13 pages.
Office Action for U.S. Appl. No. 14/612,025 dated Feb. 1, 2016, 12 pages.
Office Action for U.S. Appl. No. 13/952,467 dated Jan. 15, 2016, 22 pages.
Office Action for U.S. Appl. No. 14/194,499 dated May 18, 2016, 10 pages.
Office Action for U.S. Appl. No. 14/207,430 dated Oct. 15, 2015, 57 pages.
Office Action for U.S. Appl. No. 14/207,430 dated Mar. 10, 2016, 78 pages.
Office Action for U.S. Appl. No. 14/207,430 dated Jul. 25, 2016, 79 pages.
Office Action for U.S. Appl. No. 14/213,953 dated Nov. 9, 2015, 20 pages.
Office Action for U.S. Appl. No. 14/383,079 dated May 10, 2016, 7 pages.
Office Action for U.S. Appl. No. 14/383,079 dated Aug. 4, 2015, 11 pages.
Office Action for U.S. Appl. No. 14/588,202 dated May 10, 2016, 8 pages.
Office Action for U.S. Appl. No. 14/588,202 dated Sep. 11, 2015, 9 pages.
Office Action for U.S. Appl. No. 14/613,301 dated Feb. 4, 2016, 42 pages.
Office Action for U.S. Appl. No. 14/613,301 dated Mar. 31, 2015, 58 pages.
Office Action for U.S. Appl. No. 14/613,301 dated Jul. 31, 2015, 26 pages.
Office Action for U.S. Appl. No. 14/887,050 dated Mar. 11, 2016, 12 pages.
Office Action for U.S. Appl. No. 15/046,172 dated Apr. 20, 2016, 8 pages.
Office Action mailed Apr. 1, 2013 for U.S. Appl. No. 13/174,077, filed Jun. 30, 2011.
Office Action mailed Aug. 1, 2012 for U.S. Appl. No. 12/894,098, filed Sep. 29, 2010.
Office Action mailed Mar. 1, 2012 for U.S. Appl. No. 12/835,704, filed Jul. 13, 2010.
Office Action mailed Aug. 2, 2013 for U.S. Appl. No. 13/594,665, filed Aug. 24, 2012.
Office Action mailed Sep. 2, 2014 for U.S. Appl. No. 131705,082, 41 pages.
Office Action mailed Apr. 3, 2014 for U.S. Appl. No. 13/870,919, filed Apr. 25, 2013.
Office Action mailed Oct. 3, 2013 for U.S. Appl. No. 13/921,157, filed Jun. 18, 2013.
Office Action mailed Apr. 5, 2012 for U.S. Appl. No. 12/833,898, filed Jul. 9, 2010.
Office Action mailed Oct. 5, 2011 for U.S. Appl. No. 11/875,541, filed Oct. 19, 2007.
Office Action mailed Dec. 6, 2013 for U.S. Appl. No. 13/564,639, filed Aug. 1, 2012.
Office Action mailed Dec. 6, 2013 for U.S. Appl. No. 13/960,735, filed Aug. 6, 2013.
Office Action mailed Feb. 6, 2014 for U.S. Appl. No. 13/434,567, filed Mar. 29, 2012.
Office Action mailed Mar. 6, 2013 for U.S. Appl. No. 13/174,264, filed Jun. 30, 2011.
Office Action mailed Mar. 6, 2013 for U.S. Appl. No. 13/679,976, filed Nov. 16, 2012.
Office Action mailed Sep. 6, 2011 for U.S. Appl. No. 12/582,086, filed Oct. 20, 2009.
Office Action mailed Dec. 7, 2012 for U.S. Appl. No. 13/436,714, filed Mar. 30, 2012.
Office Action mailed Mar. 7, 2013 for U.S. Appl. No. 13/651,169, filed Oct. 12, 2012.
Yin S., "Solution Processed Silver Sulfide Thin Films for Filament Memory Applications", Technical Report No. UCB/EECS-2010-166, Dec. 17, 2010, Electrical Engineering and Computer Sciences, University of California at Berkeley. Retrieved from the Internet.
Office Action mailed Jan. 8, 2014 for U.S. Appl. No. 12/861,432, filed Aug. 23, 2010.
Office Action mailed Jun. 8, 2012 for U.S. Appl. No. 11/875,541, filed Oct. 19, 2007.
Office Action mailed Aug. 9, 2013 for U.S. Appl. No. 13/764,710, filed Feb. 11, 2013.
Office Action mailed Jul. 9, 2013 for U.S. Appl. No. 13/447,036, filed Apr. 13, 2012.
Office Action mailed Jul. 9, 2014 for U.S. Appl. No. 14/166,691, filed Jan. 28, 2014.
Office Action mailed Oct. 9, 2012 for U.S. Appl. No. 13/417,135, filed Mar. 9, 2012.
Office Action mailed Jan. 10, 2014 for U.S. Appl. No. 13/920,021, filed Jun. 17, 2013.
Office Action mailed Apr. 11, 2014 for U.S. Appl. No. 13/143,047, filed Jun. 30, 2011.
Office Action mailed Feb. 11, 2014 for U.S. Appl. No. 13/620,012, filed Sep. 14, 2012.
Office Action mailed Jul. 11, 2013 for U.S. Appl. No. 13/764,698, filed Feb. 11, 2013.
Office Action mailed Sep. 11, 2014 for U.S. Appl. No. 13/739,283, filed Jan. 11, 2013.
Office Action mailed Aug. 12, 2013 for U.S. Appl. No. 13/077,941, filed Mar. 31, 2011.
Office Action mailed Mar. 12, 2014 for U.S. Appl. No. 13/167,920, filed Jun. 24, 2011.
Office Action mailed Sep. 12, 2014 for U.S. Appl. No. 13/426,869, filed Mar. 22, 2012.
Office Action mailed Sep. 12, 2014 for U.S. Appl. No. 13/756,498.

(56) References Cited

OTHER PUBLICATIONS

Office Action mailed Dec. 3, 2015 for U.S. Appl. No. 14/253,796.
Office Action mailed Feb. 13, 2014 for U.S. Appl. No. 13/174,077, filed Jun. 30, 2011.
Office Action mailed Mar. 14, 2012 for U.S. Appl. No. 12/815,369, filed Jun. 14, 2010.
Office Action mailed Mar. 14, 2014 for U.S. Appl. No. 12/835,704, filed Jul. 13, 2010.
Office Action mailed Apr. 15, 2016 for U.S. Appl. No. 14/597,151.
Office Action mailed Apr. 16, 2012 for U.S. Appl. No. 12/834,610, filed Jul. 12, 2010.
Office Action mailed Jan. 16, 2014 for U.S. Appl. No. 13/739,283, filed Jan. 11, 2013.
Office Action mailed May 16, 2012 for U.S. Appl. No. 12/815,318, filed Jun. 14, 2010.
Office Action mailed Oct. 16, 2012 for U.S. Appl. No. 12/861,650, filed Aug. 23, 2010.
Office Action mailed Apr. 17, 2012 for U.S. Appl. No. 12/814,410, filed Jun. 11, 2010.
Office Action mailed Feb. 17, 2011 for U.S. Appl. No. 12/913,719, filed Oct. 27, 2010.
Office Action mailed Jun. 17, 2014 for U.S. Appl. No. 14/072,657, filed Nov. 5, 2013.
Office Action mailed Mar. 17, 2015 for U.S. Appl. No. 14/573,770.
Office Action mailed Apr. 8, 2016 for U.S. Appl. No. 14/573,770.
Written Opinion for Application No. PCT/US2009/061249, mailed on May 19, 2010, 3 pages.
Written Opinion for Application No. PCT/US2011/040090, mailed on Feb. 17, 2012, 6 pages.
Written Opinion for Application No. PCT/US2011/045124, mailed on May 29, 2012, 5 pages.
Office Action dated May 7, 2013 for U.S. Appl. No. 13/585,759, 22 pages.
Notice of Allowance dated Sep. 19, 2013 for U.S. Appl. No. 13/585,759, 13 pages.
Office Action dated Aug. 19, 2013 for U.S. Appl. No. 13/585,759, 15 pages.
International Search Report and Written Opinion for PCT/US2013/054976 dated Dec. 16, 2013, 11 pages.
Office Action dated Apr. 6, 2015 for U.S. Appl. No. 14/034,390, 27 pages.
Office Action mailed Apr. 19, 2011 for U.S. Appl. No. 12/582,086, filed Oct. 20, 2009.
Office Action mailed Jun. 19, 2012 for U.S. Appl. No. 13/149,757, filed May 31, 2011.
Office Action mailed Mar. 19, 2013 for U.S. Appl. No. 13/465,188, filed May 7, 2012.
Office Action mailed Mar. 19, 2013 for U.S. Appl. No. 13/564,639, filed Aug. 1, 2012.
Office Action mailed May 20, 2013 for U.S. Appl. No. 13/725,331, filed Dec. 21, 2012.
Office Action mailed Nov. 20, 2012 for U.S Appl. No. 13/149,653, filed May 31, 2011.
Office Action mailed Sep. 20, 2013 for U.S. Appl. No. 13/481,600, filed May 25, 2012.
Office Action mailed Mar. 21, 2014 for U.S. Appl. No. 13/447,036, filed Apr. 13, 2012.
Office Action mailed May 21, 2014 for U.S. Appl. No. 13/764,698, filed Feb. 11, 2013.
Office Action mailed Sep. 21, 2011 for U.S. Appl. No. 12/835,704, filed Jul. 13, 2010.
Office Action mailed Jul. 22, 2010 for U.S. Appl. No. 11/875,541, filed Oct. 19, 2007.
Office Action mailed Jul. 22, 2011 for U.S. Appl. No. 12/913,719, filed Oct. 27, 2010.
Office Action mailed Sep. 22, 2013 for U.S. Appl. No. 13/189,401, filed Jul. 22, 2011.
Office Action mailed May 23, 2013 for U.S. Appl. No. 13/592,224, filed Aug. 22, 2012.
Office Action mailed Aug. 24, 2011 for U.S. Appl. No. 12/835,699, filed Jul. 13, 2010.
Office Action mailed Apr. 25, 2012 for U.S. Appl. No. 13/149,653, filed May 31, 2011.
Office Action mailed Apr. 25, 2014 for U.S. Appl. No. 13/761,132, filed Feb. 6, 2013.
Office Action mailed Jan. 25, 2012 for U.S. Appl. No. 12/861,650, filed Aug. 23, 2010.
Office Action mailed Oct. 25, 2012 for U.S. Appl. No. 13/461,725, filed May 1, 2012.
Office Action mailed Sep. 25, 2013 for U.S. Appl. No. 13/194,479, filed Jul. 29, 2011.
Office Action mailed Nov. 26, 2012 for U.S. Appl. No. 13/156,232.
Office Action mailed Aug. 27, 2013 for U.S. Appl. No. 13/436,714, filed Mar. 30, 2012.
Office Action mailed Dec. 27, 2013 for U.S. Appl. No. 13/525,096, filed Jun. 15, 2012.
Office Action mailed Mar. 27, 2012 for U.S. Appl. No. 13/314,513, filed Dec. 8, 2011.
Office Action mailed Mar. 13, 2012 for U.S. Appl. No. 12/625,817, filed Nov. 25, 2009.
Office Action mailed Jan. 29, 2014 for U.S. Appl. No. 13/586,815, filed Aug. 15, 2012.
Office Action mailed Jul. 29, 2013 for U.S. Appl. No. 13/466,008, filed May 7, 2012.
Office Action mailed Mar. 29, 2013 for U.S. Appl. No. 12/861,432, filed Aug. 23, 2010.
Office Action mailed Jul. 30, 2012 for U.S. Appl. No. 12/900,232, filed Oct. 7, 2010.
Office Action mailed Jun. 30, 2014 for U.S. Appl. No. 13/531,449, filed Jun. 22, 2012.
Office Action mailed Mar. 30, 2011 for U.S. Appl. No. 11/875,541, filed Oct. 19, 2007.
Office Action mailed Sep. 30, 2013 for U.S. Appl. No. 13/189,401, filed Jul. 22, 2011.
Office Action mailed Sep. 30, 2013 for U.S. Appl. No. 13/462,653, filed May 2, 2012.
Office Action dated Apr. 6, 2015 for U.S. Appl. No. 13/912,136, 23 pages.
Office Action mailed May 20, 2016 for U.S. Appl. No. 14/613,299.
Office Action mailed Jul. 9, 2015 for U.S. Appl. No. 14/573,817.
Owen A.E., et al., "Electronic Switching in Amorphous Silicon Devices: Properties of the Conducting Filament", Proceedings of 5th International Conference on Solid-State and Integrated Circuit Technology, IEEE, 1998, pp. 830-833.
Owen A.E., et al., "Memory Switching in Amorphous Silicon Devices," Journal of Non-Crystalline Solids, 1983, vol. 50-60 (Pt.2), pp. 1273-1280.
Owen A.E., et al., "New Amorphous-Silicon Electrically Programmable Nonvolatile Switching Device," Solid-State and Electron Devices, IEEE Proceedings, 1982, vol. 129 (Pt. 1), pp. 51-54.
Owen A.E., et al., "Switching in Amorphous Devices," International Journal of Electronics, 1992, vol. 73 (5), pp. 897-906.
Rose M.J., et al., "Amorphous Silicon Analogue Memory Devices," Journal of Non-Crystalline Solids, 1989, vol. 115, pp. 168-170.
Russo U., et al., "Self-Accelerated Thermal Dissolution Model for Reset Programming in Unipolar Resistive-Switching Memory (RRAM) Devices," IEEE Transactions on Electron Devices, 2009, vol. 56 (2), pp. 193-200.
Scott J.C., "Is There an Immortal Memory?," American Association for the Advancement of Science, 2004, vol. 304 (5667), pp. 62-63.
Shin W., et al., "Effect of Native Oxide on Polycrystalline Silicon CMP," Journal of the Korean Physical Society, 2009, vol. 54 (3), pp. 1077-1081.
Stikeman A., Polymer Memory—The Plastic Path to Better Data Storage, Technology Review, Sep. 2002, pp. 31. Retrieved from the Internet.
Suehle J.S., et al., "Temperature Dependence of Soft Breakdown and Wear-out in Sub-3 Nm SiO2 Films", 38th Annual International Reliability Physics Symposium, San Jose, California, 2000, pp. 33-39.

(56) References Cited

OTHER PUBLICATIONS

Sune J., et al., "Nondestructive Multiple Breakdown Events in Very Thin SiO2 Films," Applied Physics Letters, 1989, vol. 55, pp. 128-130.
Terabe K., et al., "Quantized Conductance Atomic Switch," Nature, 2005, vol. 433, pp. 47-50.
Waser R., et al., "Nanoionics-based Resistive Switching Memories," Nature Materials, 2007, vol. 6, pp. 833-835.
Written Opinion for Application No. PCT/US2009/060023, mailed on May 18, 2010, 3 pages.
Japanese Office Action mailed on Aug. 9, 2016 for Japanese Application No. 2014-513700, 8 pages (including translation).
Chinese Office Action mailed on Sep. 1, 2016 for Chinese Application No. 201380027469.8, 8 pages (including translation).
Office Action dated Aug. 12, 2016 for U.S. Appl. No. 14/667,346, 27 pages.
Office Action dated Aug. 12, 2016 for U.S. Appl. No. 14/613,301, 43 pages.
Office Action dated Aug. 23, 2016 for U.S. Appl. No. 14/613,585, 9 pages.
Notice of Allowance dated Sep. 14, 2016 for U.S. Appl. No. 14/588,202, 119 pages.
Notice of Allowance dated Oct. 5, 2016 for U.S. Appl. No. 14/887,050, 113 pages.
Notice of Allowance dated Oct. 7, 2016 for U.S. Appl. No. 14/213,953, 43 pages.
Notice of Allowance for U.S. Appl. No. 14/509,967 dated Oct. 24, 2016, 42 pages.
Notice of Allowance for U.S. Appl. No. 14/383,079 dated Aug. 17, 2016, 71 pages.
Notice of Allowance for U.S. Appl. No. 14/611,022 dated Oct. 26, 2016, 41 pages.
Notice of Allowance for U.S. Appl. No. 13/952,467 dated Sep. 28, 2016, 128 pages.
Notice of Allowance for U.S. Appl. No. 15/046,172 dated Oct. 4, 2016, 116 pages.
Notice of Allowance for U.S. Appl. No. 14/612,025 dated Oct. 19, 2016, 108 pages.
Office Action for U.S. Appl. No. 14/597,151 dated Oct. 20, 2016, 52 pages.
Notice of Allowance for U.S. Appl. No. 14/692,677 dated Nov. 21, 2016, 97 pages.
Corrected Notice of Allowability dated Dec. 6, 2016 for U.S. Appl. No. 14/383,079, 33 pages.
Notice of Allowance for U.S. Appl. No. 14/194,499 dated Dec. 12, 2016, 125 pages.
Taiwanese Office Action mailed on Dec. 6, 2016 for Taiwanese Application No. 102129266, 7 pages (with English translation).
Office Action for U.S. Appl. No. 14/667,346 dated Feb. 9, 2017, 29 pages.
Chinese Office Action dated Feb. 17, 2017 for Chinese Application No. 201280027066.9, 9 pages (with English translation).
Taiwanese Office Action dated Apr. 20, 2017 for Taiwanese Application No. 103109555, 12 pages (with English translation).
Office Action for U.S. Appl. No. 14/587,711 dated Apr. 21, 2017, 134 pages.
Korean Office Action dated Apr. 17, 2017 for Korean Application No. 10-2011-0069311, 20 pages (with English translation).
Office Action for U.S. Appl. No. 14/667,346 dated Jun. 2, 2017, 115 pages.

\* cited by examiner

MONOLITHICALLY INTEGRATED RESISTIVE MEMORY USING INTEGRATED-CIRCUIT FOUNDRY COMPATIBLE PROCESSES

CROSS-REFERENCE TO RELATED APPLICATIONS

This application claims priority to, and the benefit of, U.S. Provisional Patent Application Ser. No. 61/937,412, filed Feb. 7, 2014, and entitled "MONOLITHICALLY INTEGRATED RESISTIVE MEMORY USING INTEGRATED-CIRCUIT FOUNDRY COMPATIBLE PROCESSES", and is related to U.S. patent application Ser. No. 14/034,390 filed Sep. 23, 2013, which is a continuation of U.S. patent application Ser. No. 13/585,759 filed Aug. 14, 2012, now U.S. Pat. No. 8,569,172 issued Oct. 29, 2013; each of the foregoing are expressly incorporated by reference herein in their respective entireties and for all purposes.

TECHNICAL FIELD

This disclosure relates generally to electronic memory, for example, the disclosure describes a monolithically integrated resistive memory that can be fabricated using integrated-circuit foundry compatible processes.

BACKGROUND

Resistive memory devices represent a recent innovation within the field of integrated circuit technology. While much of this technology is in the development stages, various technological concepts for proposed resistive memory devices and fabrication of the same have been demonstrated by the inventors. The inventors believe that various resistive memory technologies and various techniques for fabricating various resistive memory devices show compelling evidence to hold substantial advantages over competing technologies in the semiconductor electronics industry.

Over time, advancement in technology has provided an increase in a number of semiconductor devices, such as transistors, that can be fabricated on a given geometric area of a semiconductor chip. An implication of increasing the number of semiconductor devices is increasing memory capacity and processing power for the semiconductor chip and associated electronic devices.

In light of the above, the inventors desire to continue developing practical utilization and fabrication of resistive memory technology.

SUMMARY

The following presents a simplified summary of the specification in order to provide a basic understanding of some aspects of the specification. This summary is not an extensive overview of the specification. It is intended to neither identify key or critical elements of the specification nor delineate the scope of any particular embodiments of the specification, or any scope of the claims. Its purpose is to present some concepts of the specification in a simplified form as a prelude to the more detailed description that is presented in this disclosure.

Aspects of the subject disclosure provide for a monolithically integrated resistive memory using integrated-circuit foundry compatible processes. An embodiment relates to a memory device that can include a substrate comprising one or more complementary metal-oxide semiconductor devices and a first insulator layer formed on the substrate. The memory device also includes a monolithic stack that can include multiple layers fabricated as part of a monolithic process over the first insulator layer. The multiple layers can include a first metal layer (e.g., a first metallization layer), a second insulator layer, and a second metal layer (e.g., a second metallization layer). A resistive memory device structure can be formed within the second insulator layer. In various embodiments, the resistive memory device is formed within a thermal budget of the one or more complementary metal-oxide semiconductor devices. In further embodiments, the resistive memory device structure can be implemented at least in part as a pillar device. In additional embodiments, at least a first portion of the first metal layer can be coupled to at least a second portion of the second metal layer.

According to some implementations, a defined distance between the first metal layer and the second metal layer can be substantially similar to a distance between the second metal layer and a third metal layer. In other words, a thickness of the interlayer dielectric is not changed to accommodate the formation of the resistive memory device structure in the second insulator layer. Accordingly, embodiments discussed herein are compatible with current integrated-circuit (IC) designs.

In some implementations, the resistive memory device structure can be fabricated at a temperature of 450 degrees Celsius or lower. In some embodiments, the complementary metal-oxide semiconductor circuitry layer can utilize a gate dielectric material that has a high relative dielectric constant compared to silicon dioxide. In one embodiment, the gate dielectric material employed for the complementary metal-oxide semiconductor devices may be Applied Materials Producer® Black Diamond® (HBD3) low-k dielectric (e.g. $k<=3.0$).

In embodiments where the memory device structure is implemented at least in part as a pillar device, the pillar device can include a pillar-type structure (of a contact material) formed on the first metal layer and a collar-type structure disposed on top of the pillar-type structure. The collar-type structure can include two or more layers of materials arranged in a stack-like structure above the pillar-type structure. The cross-section of the collar-type structure can be larger than the pillar-type structure in one or more embodiments. In some embodiments, the two or more layers can include a first layer in a cylinder-type structure disposed above a second cylinder-type structure. The second cylinder-type structure contacts the second metal layer at a first surface, and a second surface coupled to the first cylinder-type structure. Further to this implementation, the first cylinder-type structure has a first side that contacts the pillar-type structure and a second side that contacts the second surface of the second cylinder-type structure. The first surface and the second surface can be located on opposite sides of the second cylinder-like structure.

Another embodiment relates to a method of fabricating a memory device. In various embodiments, the method can be a foundry-compatible method (e.g., consistent with a fabrication process of at least one integrated circuit foundry, whether currently existing or future variants). The method can include fabricating a monolithic stack that can include multiple layers. Fabricating the multiple layers can be performed within a thermal budget of a substrate. In an embodiment, the substrate can be a substrate comprising one or more CMOS devices formed therein or thereon. Further, fabricating the multiple layers can include providing the substrate comprising one or more complementary metal-oxide semiconductor devices and fabricating a first insulator layer over the substrate. The method can also include fabricating a first metal layer over the first insulator layer. Further, the method can include fabricating an interlayer dielectric material layer over the first metal layer and fabricating a resistive memory device structure within the interlayer dielectric material layer, which can include forming a pillar device. Further, the method can include fabricating a second metal layer over the resistive memory device structure.

In accordance with another implementation, fabricating the monolithic stack can include fabricating the monolithic stack at a temperature of about 450 degrees Celsius. The temperature can be about 450 degrees Celsius or lower in further embodiments. In various embodiments, fabrication of the monolithic stack can include fabricating the monolithic stack at a range of temperatures selected from a range group consisting of: about 450 degree and about 400 degrees Celsius, about 400 degrees and about 350 degrees Celsius, and about 300 degrees and about 350 degree Celsius.

A further embodiment relates to a memory cell that can include a substrate comprising one or more complementary metal-oxide semiconductor devices and a first insulator layer formed on the substrate. The memory cell can also include a monolithic stack comprising multiple layers fabricated as part of a monolithic process over the first insulator layer. The multiple layers can include a first metal layer formed on a top surface of the substrate, a first conductive layer formed on the first metal layer, a second insulator layer, and a second metal layer. A resistive memory device structure can be formed within the second insulator layer and within a thermal budget of the one or more complementary metal-oxide semiconductor devices. Further, the first metal layer is coupled to the second metal layer.

Yet another embodiment relates to a memory device that includes a substrate comprising one or more complementary metal-oxide semiconductor devices and a first insulator layer formed on the substrate. The memory device also includes a monolithic stack comprising multiple layers fabricated as part of a monolithic process over the first insulator layer. The multiple layers can include a first metal layer, a second insulator layer, and a second metal layer. A resistive memory device structure can be formed within the second insulator layer and within a thermal budget of the one or more complementary metal-oxide semiconductor devices. The resistive memory device structure can be implemented as a via device. Further, the first metal layer can be coupled to the second metal layer.

Another embodiment relates to a method of fabricating a memory device. The method can include fabricating a monolithic stack that comprises multiple layers, wherein the fabricating is performed within a thermal budget of a substrate. The fabricating can include providing the substrate comprising one or more complementary metal-oxide semiconductor devices and fabricating a first insulator layer over the substrate. Further, the fabricating can include fabricating a first metal layer over the first insulator layer and fabricating an interlayer dielectric material layer over the first metal layer. Also included can be fabricating a resistive memory device structure within the interlayer dielectric material layer comprising forming a via device and fabricating a second metal layer over the resistive memory device structure.

Still another embodiment relates to a memory cell that includes a substrate comprising one or more complementary metal-oxide semiconductor devices, a first insulator layer formed on the substrate, and a monolithic stack comprising multiple layers fabricated as part of a monolithic process over the first insulator layer. The multiple layers comprise a first metal layer formed on a top surface of the substrate, a first conductive layer formed on the first metal layer, a second insulator layer, and a second metal layer. A resistive memory device structure is formed within the second insulator layer and within a thermal budget of the one or more complementary metal-oxide semiconductor devices. The resistive memory device structure is implemented as a via device. In addition, the first metal layer is coupled to the second metal layer.

The following description and the drawings set forth certain illustrative aspects of the specification. These aspects are indicative, however, of but a few of the various ways in which the principles of the specification may be employed. Other advantages and novel features of the specification will become apparent from the following detailed description of the specification when considered in conjunction with the drawings.

BRIEF DESCRIPTION OF THE DRAWINGS

Numerous aspects, embodiments, objects, and advantages of the instant invention will be apparent upon consideration of the following detailed description, taken in conjunction with the accompanying drawings, in which like reference characters refer to like parts throughout. In this specification, numerous specific details are set forth in order to provide a thorough understanding of this disclosure. It should be understood, however, that certain aspects of the subject disclosure may be practiced without these specific details, or with other methods, components, or materials. In other instances, well-known structures and devices are shown in block diagram form to facilitate describing the subject disclosure.

DETAILED DESCRIPTION

Figure 1:
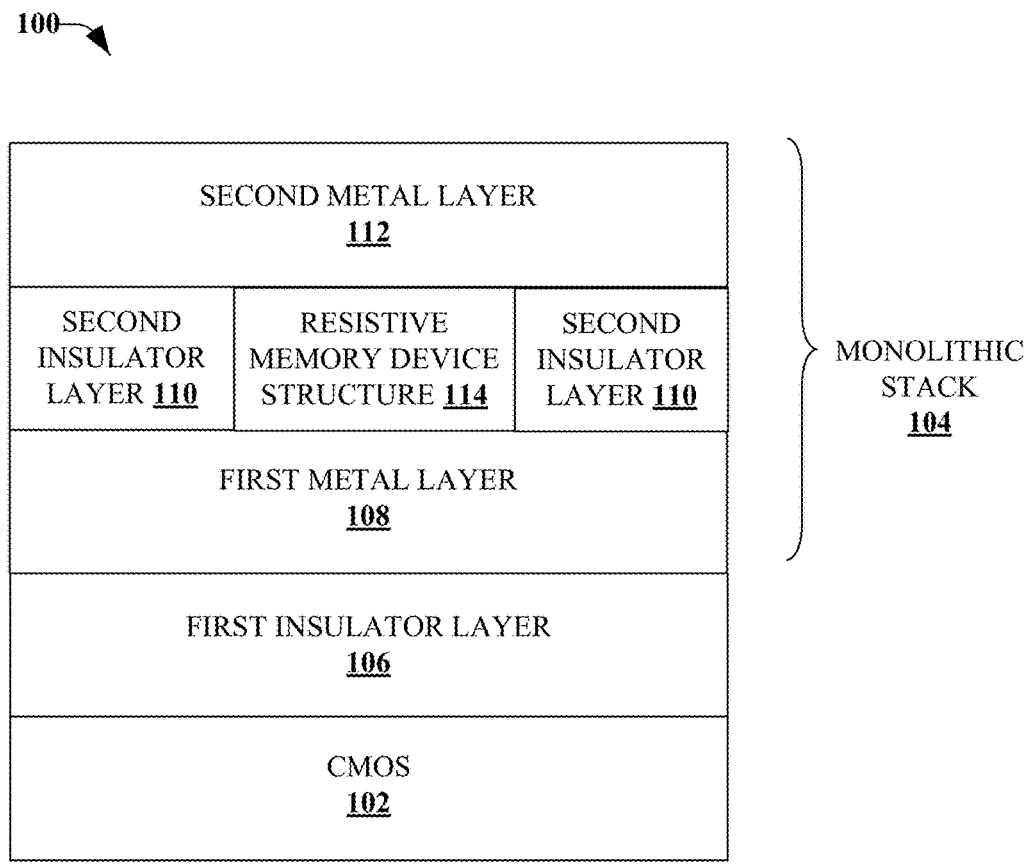
FIG. 1 depicts a block diagram of an example memory cell using integrated-circuit foundry compatible processes, according to one or more embodiments of the subject disclosure.

This disclosure relates to two-terminal memory cells employed for digital or multi-level information storage. In some embodiments, the two-terminal memory cells can include a resistive technology, such as a resistive-switching two-terminal memory cell. Resistive-switching two-terminal memory cells (also referred to as resistive-switching memory cells or resistive-switching memory), as utilized herein, comprise circuit components having conductive contacts with an active region between the two conductive contacts. The active region of the two-terminal memory device, in the context of resistive-switching memory, exhibits a plurality of stable or semi-stable resistive states, each resistive state having a distinct electrical resistance. Moreover, respective ones of the plurality of states can be formed or activated in response to a suitable electrical signal applied at the two conductive contacts. The suitable electrical signal can be a voltage value, a current value, a voltage or current polarity, an electric or magnetic field, or the like, or a suitable combination thereof. An example of a resistive switching two-terminal memory device, though not exhaustive, can include a resistive random access memory (RRAM).

Embodiments of the subject disclosure can provide a filamentary-based memory cell. One example of a filamentary-based memory cell can comprise: a contact material layer (e.g., a p-type (or n-type) silicon (Si) bearing layer (e.g., p-type or n-type polysilicon, p-type polycrystalline SiGe, etc.)), a resistive switching layer (RSL) including a plurality of defect locations, and an active metal layer to facilitate generation of particles (e.g., metal ions, atoms capable of being ionized in response to a suitable field, or other suitable stimulus, or like particles) within, or at a boundary of, the RSL. Under suitable bias conditions (e.g., programming voltage), the particles (e.g., metal ions, atoms capable of being ionized, etc.) can migrate to the defect locations within the RSL to provide filament forming ions to the RSL. Upon removal of the bias condition a conductive filament formed by the ions within the RSL at least in part deforms. In some embodiments, deformation of the filament can comprise the particles (e.g., metal ions)—trapped within the defect locations—becoming neutral particles (e.g., metal atoms) in absence of the bias condition that have a high electrical resistance. In other embodiments, deformation of the filament can comprise dispersion (or partial dispersion) of the particles within the RSL, breaking a conductive electrical path provided by the filament in response to the bias condition. In still other embodiments, deformation of the filament can be in response to another suitable physical mechanism, or a suitable combination of the foregoing.

The RSL (which can also be referred to in the art as a resistive switching media (RSM)) can comprise, for example, an undoped amorphous Si layer, a semiconductor layer having intrinsic characteristics, a Si sub-oxide (e.g., SiOx wherein x has a value between 0.1 and 2) a non-stoichiometric oxide, a metallic oxide (e.g. Zinc Oxide) and so forth. Other examples of materials suitable for the RSL could include $Si_XGe_YO_Z$ (where X, Y, and Z are respective suitable positive integers), a silicon oxide (e.g., $SiO_N$, where N is a suitable positive integer), amorphous Si (a-Si), amorphous SiGe (a-SiGe), $TaO_B$ (where B is a suitable positive integer), $HfO_C$ (where C is a suitable positive integer), $TiO_D$ (where D is a suitable positive integer), and so forth, or a suitable combination thereof.

Examples of the active metal layer can include, among others: silver (Ag), gold (Au), titanium (Ti), titanium-nitride (TiN) or other suitable compounds of titanium, nickel (Ni), copper (Cu), aluminum (Al), chromium (Cr), tantalum (Ta), iron (Fe), manganese (Mn), tungsten (W), vanadium (V), cobalt (Co), platinum (Pt), and palladium (Pd). Other suitable conductive materials, as well as compounds or combinations of the foregoing or similar materials can be employed for the active metal layer in some aspects of the subject disclosure. In some embodiments, a thin layer of barrier material composed of Ti, TiN, or the like, may be disposed between the RSL and the active metal layer (e.g., Ag, Al, and so on). Details pertaining to additional embodiments of the subject disclosure similar to the foregoing example(s) can be found in the following U.S. patent applications that are licensed to the assignee of the present application for patent: application Ser. No. 11/875,541 filed Oct. 19, 2007, application Ser. No. 12/575,921 filed Oct. 8, 2009, and the others cited herein, each of which are incorporated by reference herein in their respective entireties and for all purposes.

According to various disclosed embodiments, disclosed resistive switching devices can be fabricated consistent with foundry compatible processes. As utilized herein, foundry compatible refers to consistency with physical constraints associated with fabrication of a semiconductor-based device in a commercial semiconductor fabrication foundry, such as Taiwan Semiconductor Manufacturing Corporation, among others. Physical constraints include a thermal budget (e.g., maximum operating temperature) of a die, and of materials and metals constructed on the die prior to a given process step. For example, where a die comprises one or more metal layers or constructs, and viability of device models require the metal layers to maintain tight position tolerance, the thermal budget may be set by the softening temperature of the metal(s) to avoid loss of metal rigidity. Other physical constraints can include, CMOS, nMOS or pMOS fabrication constraints, where suitable, fabrication toolset limitations of a particular metallization scheme (e.g., etching/masking/grooving toolsets available for Aluminum, Copper, etc.), physical properties requiring special process handling (e.g., dispersion properties of Cu, oxidation properties of metals, semi-conducting materials, etc.), or the like, or other constraints of commercial foundry. Accordingly, the phrase "foundry compatible" implies consistency with process limitations of at least one commercial semiconductor fabrication foundry.

To program a filamentary-based resistive switching memory cell, a suitable program voltage(s) can be applied across the memory cell causing a conductive path or a filament of varying width and length to form within a relatively high resistive portion of the memory cell (e.g., the resistive switching layer). This causes the memory cell to switch from a relatively high resistive state, to one or more relatively low resistive states. In some resistive-switching devices, an erase process can be implemented to deform the conductive filament, at least in part, causing the memory cell to return to the high resistive state from the low resistive state(s). This change of state, in the context of memory, can be associated with respective states of a binary bit or multiple binary bits. For an array of multiple memory cells, a word(s), byte(s), page(s), block(s), etc., of memory cells can be programmed or erased to represent zeroes or ones of binary information, and by retaining those states over time in effect storing the binary information. In various embodiments, multi-level information (e.g., multiple bits) may be stored in respective memory cells.

Although resistive memory is still in the development stages, the inventors believe that resistive memory will replace conventional NAND and NOR FLASH memory devices, as well as other memory devices. The inventors have observed that development of resistive memory has encountered a pragmatic fabrication obstacle: thermal budget constraints of associated devices (e.g., frontend of line fabrication products). Thermal budget refers to an amount of thermal energy transferred to a wafer during a particular temperature operation. During the process of manufacturing the resistive memory, for example, there is a desire to not adversely affect complementary metal oxide semiconductor (CMOS) devices by application of excess heat, or the like. Accordingly, CMOS devices within a substrate can impose a thermal budget constraint to the manufacture of memory components upon a CMOS chip or substrate (e.g., by way of a backend of line fabrication process). Likewise, thermal budget constraints should be considered during the manufacture of a resistive memory device in an integrated circuit, for instance. To address the thermal budget constraints, some techniques have attempted to make a resistive memory separate from the CMOS circuitry. Thus, in some cases the resistive memory is formed on a separate wafer from that on which the CMOS circuitry is formed. After forming the resistive memory, the wafer can be (flipped upside down and) bonded to the CMOS circuitry. The inventors realize that this imposes additional overhead costs and other challenges related to fabricating the resistive memory.

Another challenge associated with resistive memory integration is plasma damage from the resistive memory process. There can be a large amount of complex plasticating process(es) that might impact the CMOS circuitry from a plasma damage standpoint. The inventors believe that at least some plasma damage concerns have not been successfully addressed.

Another challenge or constraint with respect to monolithic integration of a resistive memory on top of a CMOS circuit includes the ability to use existing backend of line processes. The use of existing backend of line processes can mitigate or avoid alteration of the RC delays (where "R" is the metal wire resistance and "C" is the inter-layer dielectric capacitance) in the backend wiring during fabrication of the resistive memory. Variation in the RC delays can void the electrical models, for instance. For example, some techniques use a custom process to integrate memory fabrication into a backend of line process. The CMOS circuitry can have multiple layers of wiring in the backend and some techniques known to the inventors attempt to integrate memory elements into the backend. This process is complex and, until now, could not be performed without significant changes to the backend of line processes. The one or more disclosed aspects herein can incorporate at least a subset of existing backend of line processes, or improvements thereon. Further, the disclosed aspects can comply with thermal budget constraints of such processes.

An integrated circuit (IC) foundry includes various equipment and processes that are leveraged in order to incorporate the resistive memory into the backend of line process. The inventors of the present disclosure are familiar with backend material compatibility issues associated there with. The one or more disclosed aspects can perform the process of fabricating the resistive memory device in a relatively simple manner compared to other resistive memory fabrication processes. For example, a memory stack, as discussed herein, can add as few as one or two additional layers in some embodiments, compared to the twenty or thirty additional layers used by other memory fabrication processes. This can significantly reduce cost, complexity, and process overhead associated with manufacturing a resistive memory as a backend of line process. Further, various disclosed aspects can be readily scalable to a subsequent generation node (e.g., facilitating smaller memory cells and therefore greater die density), as compared to other processes.

Further, one or more disclosed aspects can enable smaller die sizes and lower costs through one or more disclosed processes for monolithic integration of resistive memory onto a product of a frontend of line process (e.g., a CMOS substrate). Further, the fabrication of the resistive memory devices may be performed using standard IC foundry-compatible fabrication processes. Various embodiments can also be implemented without design changes after monolithic integration (e.g., over a CMOS device) to account for changes in parasitic structure. A parasitic structure is a portion of the device (e.g., memory device) that resembles in structure a different semiconductor device, which might cause the device to enter an unintended mode of operation. Further, in at least one disclosed embodiment, there is provided a product (e.g., a memory device) of a fabrication process that can comprise monolithic integration of resistive memory over a CMOS circuitry. Further, the fabrication process can comprise IC foundry-compatible processes in a further embodiment (e.g., new or different processes are not necessary, though in alternative embodiments future improvements to such processes should not be excluded from the scope of various aspects of the present disclosure). In addition, the disclosed aspects can be performed without exceeding a temperature of about 450 degrees Celsius. For example, the temperature can be about 450 degrees Celsius or lower. Various aspects can be performed at a range of temperatures selected from a range group consisting of about 450 degree and 400 degrees Celsius, about 400 degrees and 350 degrees Celsius, about 300 degrees and 350 degree Celsius, and so on.

Referring now to the drawings, FIG. 1 depicts a block diagram of an example memory cell 100 using integrated-circuit foundry compatible processes, according to one or more embodiments of the subject disclosure. The memory cell 100 can include a complementary metal-oxide semiconductor (CMOS) layer 102 and a monolithic stack 104. In various embodiments, CMOS layer 102 can include memory driver circuitry, processing logic, gate arrays, a communication layer, wired or wireless communication circuitry, or the like, or a suitable combination of the foregoing.

For example, in one embodiment, a substrate could be provided that includes one or more CMOS devices formed therein. In an alternative embodiment, the one or more CMOS devices can be fabricated on, or within, the substrate. In another embodiment, the substrate can be provided with one or more CMOS devices formed therein and further comprising a fabrication of one or more additional CMOS devices on, or within, the substrate.

Prior to fabrication of the monolithic stack 104, a first insulating layer 106 can be formed over CMOS layer 102. The monolithic stack 104 can include multiple layers that are fabricated in sequence over CMOS layer 102. In some embodiments, monolithic stack 104 can be formed over first insulating layer 106 as well, whereas in at least one alternative embodiment monolithic stack 104 can be formed at least in part within first insulating layer 106. Further, one or more additional layers, not specifically depicted, can be included in the monolithic stack 104 according to alternative embodiments (e.g., see FIGS. 2 and 3, infra).

According to some embodiments, the multiple layers of the monolithic stack 104 can include a first metal layer 108, a second insulating layer 110, and a second metal layer 112. The first metal layer 108 can be formed of a first metal (e.g., W, Al, Ag, Au, a noble metal, or a similar metal, or a suitable alloy of the foregoing). The second metal layer 112 can be formed of a second metal (e.g., Al with TiN in one embodiment). Further, a resistive memory device structure 114 can be fabricated within the second insulating layer 110. The resistive memory device structure 114 can create a contact between the first metal layer 108 and the second metal layer 112.

The resistive memory device structure 114 can be fabricated within a thermal budget of the CMOS layer 102. For example, the resistive memory device structure 114 can be fabricated at a temperature of about 450 degrees Celsius. According to an embodiment, the temperature can be about 450 degrees Celsius or lower. In various embodiments, the resistive memory device structure can be fabricated at a range of temperatures selected from a range group consisting of about 450 degree and 400 degrees Celsius, about 400 degrees and 350 degrees Celsius, about 300 degrees and 350 degree Celsius, and so on.

The inventors believe the dielectric constant imposes a constraint and therefore constructing a resistive memory device with a low thermal budget can provide lower fabrication costs as compared to other high temperature memory fabrication processes that have high temperature components and that must be fabricated separate from the CMOS, as discussed above, and not as a monolithic process over the CMOS chip. As one example, a gate dielectric material employed for CMOS devices can be Applied Materials Producer Black Diamond (HBD3) low-k dielectric (e.g., $k \leq 3.0$), although the subject disclosure is not limited to this example.

In an implementation, the resistive memory device structure 114 can retain a defined distance between the first metal layer 108 and the second metal layer 112. For example, as the resistive memory device structure 114 is formed, a distance between the first metal layer 108 and the second metal layer 112 stays approximately the same. In other words, the distance between the first metal layer 108 and the second metal layer 112 does not become appreciably larger, if at all, within an established fabrication process as a result of the inclusion of the resistive memory device structure 114. In some embodiments, the distance between the first metal layer 108 and the second metal layer 112 is the same as the distance between the second metal layer 112 and a third metal (not depicted, but see, e.g., FIGS. 3 and 4, infra).

In an aspect, the resistive memory device structure 114 can be implemented in a pillar-type device. For example, the pillar-type device can include a first portion of the resistive memory device structure 114 that is formed on the first metal layer 108. The pillar-type device can also include a second portion (e.g., oversized layer) that is formed of a plurality of adjacent materials (e.g., the second portion comprising layers of multiple adjacent materials). In some embodiments, the layers of materials are cylindrical-shaped and are approximately concentric, such as a first cylinder and a second cylinder; however the subject disclosure is not limited to this embodiment. The second portion of the pillar-type device can contact the second metal layer 112. Moreover, in at least one embodiment the first portion can have a cross-section (e.g., viewed from the top or bottom) that is cylindrical or approximately cylindrical, polygonal or approximately polygonal, or the like, having a defined perimeter. Further, the second portion can have a cross-section having a larger perimeter (e.g., larger diameter, larger radius, etc.) than the defined perimeter of the first portion. In one or more embodiments, the first portion can be a cylinder (or approximate cylinder) having a first diameter, and the second portion can comprise a sequence of cylinders (or approximate cylinders) formed of one or more of the plurality of adjacent materials above the first portion and having at least one additional diameter(s) that is larger than the first diameter of the first portion of the pillar-type device.

In other embodiments, as utilized herein, a structure or device referred to with the term "cylinder" can alternatively or additionally comprise a polygonal shape, or an approximately polygonal shape. In another example, the structure or device referred to with the term cylinder can alternatively or additional comprise an ovoid or approximately ovoid shape, or the like. Further, such a structure or device can alternatively have a cone shape, an approximation of a cone, and so on. In another example, such a structure or device can be approximately a multiple sided polygon (for instance, a polygon having at least one partially rounded edge, or a polygon having at least one partially rounded corner, or multiple partially rounded edges, or multiple partially rounded corners, or a combination of the foregoing). In another example, the structure or device can have at least one side that is non-linear, such as a curved side. In a further example, the structure or device can have some non-sharp edges or some non-sharp sides. In yet another example, the structure or device can be an object that is approximately polygonal, an extruded polygon having at least one non-linear side, or an extruded polygon having at least one non-sharp edge. In some embodiments, an area of the cross-sections may be substantially similar, or different. Thus, it should be appreciated that reference to a particular geometry for a structure or device should be considered as illustrative and not to be construed as limiting.

In one example, the second portion of the pillar-type device can comprise (e.g., a collar having larger diameter or perimeter than the first portion of the pillar-type device) a first cylinder that can have a first side and a second side, located on opposite ends of the first cylinder. The pillar-type device can comprise a second cylinder that can have a first surface and a second surface, located on opposite sides of the second cylinder. A first side of the first cylinder can contact the first portion of the pillar-type device (e.g., pillar) and the second side of the first cylinder can contact the second surface of the second cylinder. The first side of the second cylinder can contact the second metal layer 112 (see, e.g., cut-out section 318 of FIG. 3, infra).

According to an embodiment, the resistive memory device structure 114 can be implemented in a pillar-like device that includes a pillar structure. The pillar structure can be formed of conducting material. In some embodiments, the pillar structure can include a prism structure (parallel bases) with a cross-sectional pattern such as a circle, approximately polygonal, ovoid, or the like. In one example, a first cylinder is formed of switching material and a second cylinder is formed of another conducting material. In an aspect, the conducting material of the pillar structure and the second cylinder are different materials. However, according to some aspects, the material of the pillar structure and the second cylinder can be the same material or a similar material.

According to an implementation, a pillar-type device can be formed at least in part from a via—created by forming a hole, void, etc., from another material—that is filled with one or more materials or layers of materials (and in such case may also be referred to herein as a via device). In one embodiment, a pillar-type device can be formed at least in part by a material that fills at least a subset of the via (e.g., fills a subset of the hold, void, etc.). In a further embodiment, the pillar-type device can comprise a via liner formed of a material deposited over a surface of the other material exposed by the via. The via liner material can be selected from, among others: Silicon Oxide (SiOx), a compound of SiOx and Titanium Oxide (TiOx), and a compound of SiOx and Aluminum Oxide (AlOx), or a similar material(s), or suitable combinations thereof. In accordance with an implementation, the via device can be filled (e.g., over the via liner material) with a material selected from, among others: Al, Al and Cu, Al with TiN, Al with Ti or TiN, TiN, Al and Cu or TiN, or suitable combinations thereof, or a similar material(s).

In some implementations, referring back to the second portion of the pillar-type device, the first cylinder can have a first thickness and the second cylinder can have a second thickness, different from the first thickness. Thus, the first cylinder can be thicker than the second cylinder. However, according to other aspects, the first cylinder can be thinner than the second cylinder.

Figure 2:
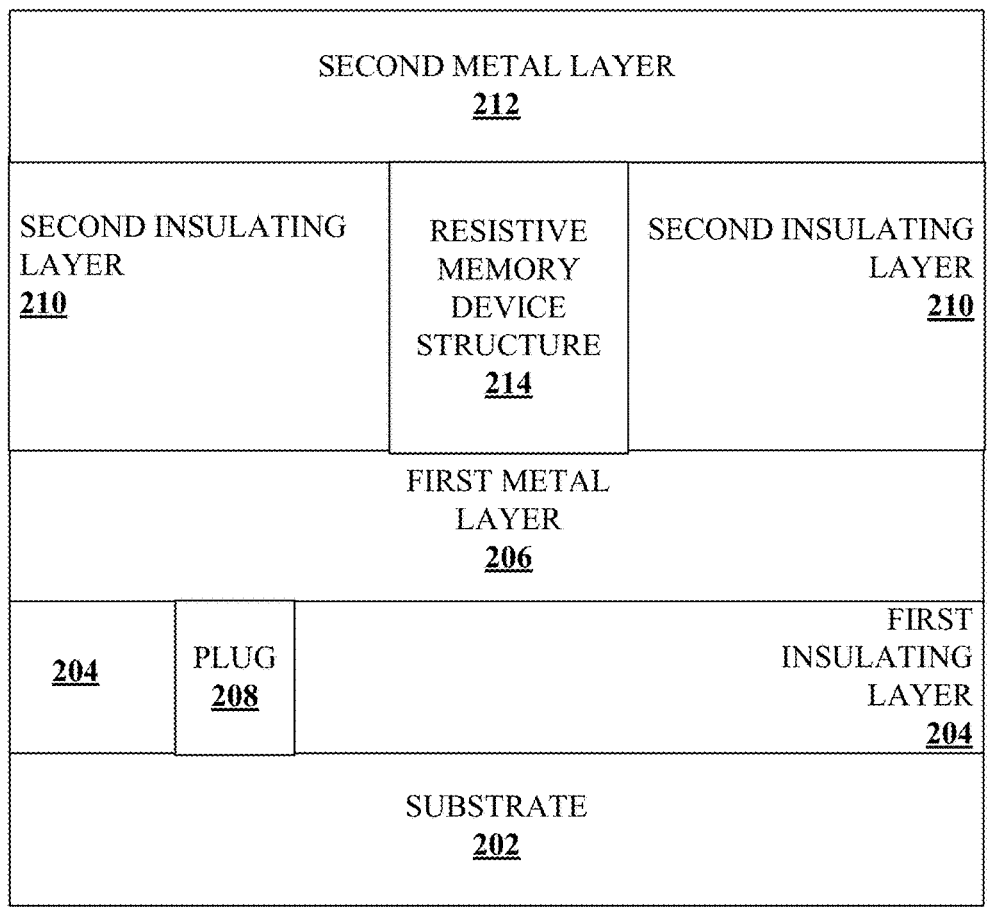
FIG. 2 depicts a block diagram of another example memory cell using integrated-circuit foundry compatible processes, according to one or more embodiments of the subject disclosure.

FIG. 2 depicts a block diagram of another example memory cell 200 using integrated-circuit foundry compatible processes, according to one or more embodiments of the subject disclosure. Memory cell 200 can include a substrate 202, a first insulating layer 204, and a first metal layer 206 formed over a top surface of the first insulating layer 204 and the substrate 202. In various disclosed embodiments, the substrate 202 can be a complementary metal oxide semiconductor (CMOS) substrate having one or more CMOS-compatible devices. Further, the first metal layer 206 can be formed of W, Al, or a similar material.

In various embodiments, the CMOS layer 102 may include memory driver circuitry, processing logic, gate arrays, or the like. For example, in one embodiment, a substrate 202 could be provided that includes one or more CMOS devices formed therein. In an alternative embodiment, the one or more CMOS devices can be fabricated at least in part within, and at least in part above, the substrate. In another embodiment, the substrate can be provided with one or more CMOS devices formed therein and further comprising a fabrication of one or more additional CMOS devices on, or within, the substrate.

In some embodiments, a first conductive plug 208 can be formed within the first insulating layer 204. The first conductive plug 208 (e.g., W) can electrically connect the substrate 202 and the first metal layer 206.

Formed on a top surface of the first metal layer 206 can be a second insulating layer 210. Formed over the second insulating layer 210 can be a second metal layer 212. The first metal layer 206, the second metal layer 212, and subsequent metal layers can be formed of metals. Further, a resistive memory device structure 214 can be formed within the second insulating layer 210. Further, as illustrated, the resistive memory device structure 214 can be formed within the first metal layer 206 and at least a portion of the first insulating layer 204. The resistive memory device structure 214 can create a contact between the first metal layer 206 and the second metal layer 212. The resistive memory device structure 214 can be formed using integrated-circuit foundry compatible processes (e.g., using existing integrated-circuit foundry tooling), according to the various aspects discussed herein.

In accordance with an aspect, forming the resistive memory device structure 214 can include retaining a defined distance between the first metal layer 206 and the second metal layer 212. For example, while forming the resistive memory device structure 214 the distance that separates the first metal layer 206 and the second metal layer 212 stays about the same as the distance before the resistive memory device structure 214 is formed.

According to another implementation, the resistive memory device structure 214 can be implemented in a via-type device. The via-type device can be one of a multitude of difference structures, including, but not limited to, a via structure (e.g., a hole, a void, etc.), a channel, a trough, and so on. The via structure can be lined with aluminum, copper, silver, a suitable compound thereof, or suitable combinations of the foregoing. In some embodiments, the lining of the via structure can be a deposition having a substantially uniform thickness over a surface(s) exposed by the via structure/channel/trough, etc. The thickness can be 20 nm or less, in some embodiments, can be a range of thicknesses selected from a group of ranges comprising: about 15 nm to about 20 nm, about 10 nm to about 15 nm, about 5 nm to about 10 nm, and less than about 1 nm to about 5 nm. Further, the via structure can include at least a portion that is fabricated with conducting material.

Figure 3:
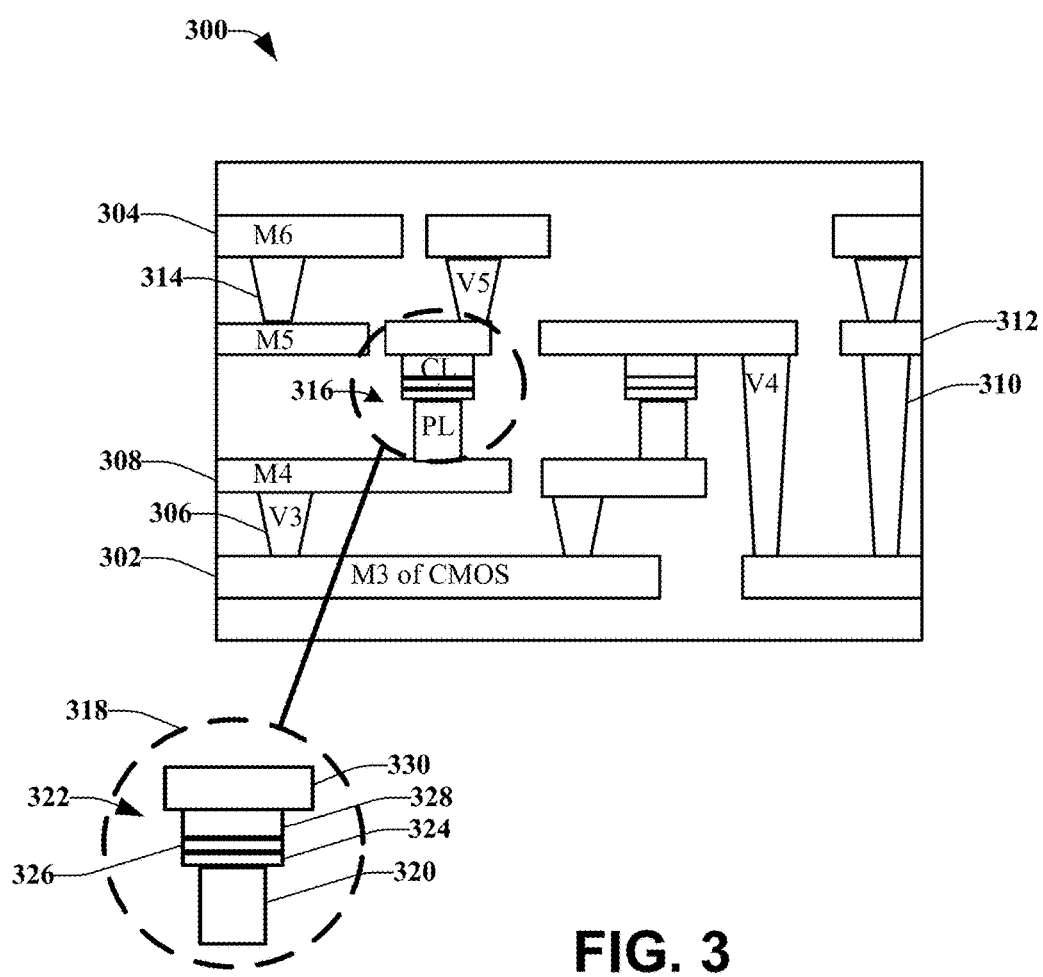
FIG. 3 depicts a block diagram of a cross-sectional view of an intermediate stage in the manufacture of an example memory architecture for a memory device, according to one or more embodiments of the subject disclosure.

FIG. 3 depicts a block diagram of a cross-sectional view of an intermediate stage in the manufacture of an example memory architecture 300 for a memory device, according to one or more embodiments of the subject disclosure. The memory architecture 300 can comprise resistive memory. One or more vertical contacts, for example, V4 contacts 310, of the memory architecture 300 can be replaced with a pillar-type device or a via-type device, according to various alternative or additional aspects. Accordingly, memory architecture 300 is not limited by a number or location of depicted pillar-type devices illustrated by FIG. 3.

It is noted that the memory architecture 300 is shown built between a first set of metals, M3 metal layers 302, and a second set of metals, M6 metal layers 304. Various components of the memory architecture 300 that are included below the M3 metal layers 302 (e.g., metals M1, metals M2, gate level components, CMOS circuitry, and so on) are not illustrated or described for purposes of simplicity. Further, additional metal layers above the M6 metal layers 304 can be included in the memory architecture 300, but are not illustrated or described for purposes of simplicity.

A first set of vertical contacts, V3 contacts 306, connect portions of the M3 metal layers 302 to portions of a third set of metals, M4 metal layers 308. Further, a second set of vertical contacts, V4 contacts 310, can connect portions of the M3 metal layers 302 to portions of a fourth set of metals, M5 metal layers 312. Further, another set of the V4 contacts 310 (though not specifically depicted) can connect portions of the M4 metal layers 308 to portions of the M5 metal layers 312. In addition, a third set of vertical contacts, V5 contacts 314, can connect portions of the M5 metal layers 312 to portions of the M6 metal layers 304.

Illustrated between portions of the M4 metal layers 308 and portions of the M5 metal layers 312, is a memory element 318. In accordance with an implementation, the memory element can be a pillar-type device 316. It is noted that although the pillar-type device 316 is illustrated between the M4 metal layers 308 and the M5 metal layers 312, one or more pillar-type devices can be formed in other places within the memory architecture 300. For example, one or more pillar-type devices can be formed between the M3 metal layers 302 and the M4 metal layers 308, between the M5 metal layers 312 and the M6 metal layers 304, or between other sets of metals, or other metal backend layers (not shown).

Further, pillar-type devices can be formed between multiple sets of metals. For example, at least one pillar-type device can be formed between the M4 metal layers 308 and the M5 metal layers 312 and at least another pillar-type device can be formed between the M5 metal layers 312 and the M6 metal layers 304, or between other metals. Thus, the pillar-type device(s) can be sandwiched between any suitable metal layers including any suitable further backend metal layers, although such metal layers are not illustrated or described for purposes of simplicity.

During the process of fabricating the memory element between sets of the metals (e.g., between the M4 metal layers 308 and the M5 metal layers 312), fabrication of memory element 318 can be provided without having to alter the spacing (e.g., defined in a backend of line process model, or the like) between the metal layers in at least some disclosed embodiments. For example, in such embodiments, the height between the respective M4 metal layers 308 and the respective M5 metal layers 312 can be substantially the same as the height between the M3 metal layers 302 and the M4 metal layers 308. Further, in an embodiment where a pillar-type device forms memory element 318 (which, e.g., can include a pillar (PL) and a collar (CL) in at least one such embodiment), a total height of the pillar-type device can be the same, or substantially the same, as a gap between the respective M4 metal layers 308 and the respective M5 metal layers 312 before placement of the memory element. In such a manner, existing dielectrics (e.g., the dielectric used before placement of the memory element, or pillar-type device, between the respective metal layers) can continue to be utilized. Further, various other existing processes used in an integrated circuit can continue to be utilized to manufacture the example memory architecture 300.

In various disclosed embodiments, the resistive memory device can be integrated monolithically on top of a substrate. In further embodiments, the substrate can be a CMOS substrate having one or more CMOS-compatible devices. In one or more other embodiments, disclosed memory device(s) can be resistive-switching two-terminal memory devices compatible in part or in full with existing CMOS fabrication techniques. Accordingly, some or all of the disclosed memory devices can be fabricated with low fabrication costs, limited retooling, and the like, resulting in high density and high efficiency two-terminal memory that the inventors believe can be fabricated and brought to market with fewer fabrication problems than can exist with other memory devices or process technologies.

To illustrate, some processes used to integrate a resistive memory might cause a change to the dielectric thicknesses or to critical dimensions in the backend and, therefore, a capacitance of a memory device can change. Therefore, the electrical design documents for these other processes have to be changed, resulting in the consumption of valuable resources (e.g., time, costs, and so on). The one or more aspects disclosed herein minimize these changes by adding or forming the resistive memory on top of the CMOS circuitry. Further, the inter-layer dielectric (ILD) thickness is maintained the same (or similar) between backend metal layers (e.g., the M4 metal layers 308 and the M5 metal layers 312, as illustrated) to mitigate or avoid changes in metal layer capacitances compared with capacitances assumed by an associated electrical design model.

Further, as illustrated by the cut-out section (dotted circle) of memory element 318, a pillar-type device, which can be placed between respective sets of the metals, can include a pillar 320 (labeled as PL) and a collar 322 (labeled as CL). For example, the pillar 320 can be placed, followed by a collar 322 comprising one or more components (e.g., one or more collar components). In one example, the collar components can be a cylinder, a polygonal cross-section, a three-dimensional object having a cylindrical cross-section, and so on. In one aspect the collar can comprise a single three-dimensional object formed of a single material. In another aspect, the collar can have multiple objects stacked or placed on top of each other comprising at least one disparate material. In another aspect, the collar can have multiple objects, at least one of which approximates a geometric cross-section (e.g., a cylinder) but is not a true geometric shape.

In various embodiments, as illustrated in FIG. 3, the collar 322 can include a resistive switching material layer 324, such as undoped amorphous silicon material layer, a non-stiochiometric silicon oxide, or the like. The collar 322 can also include an active metal layer 326 (e.g., Ag, Au, Al, a noble metal, or the like, an alloy of the foregoing, or a suitable combination thereof). In various embodiments, collar 322 can comprise a thin barrier material layer 328 between the resistive switching material and the active metal material layer, such as Ti, W, TiN, or the like. In various embodiments, a top cap 330 may be of a conductive material (e.g., Ti, W, TiN, or the like). Barrier material layer 328 or top cap 330 can be a metal plug, in alternative or additional embodiments (e.g., a W plug), providing electrical contact between memory element 318 and a portion of metal layer M5 (or other suitable metal layer in alternative embodiments). For instance, the W plug can be formed by filling with W any space that remains of a via hole after forming pillar 320 and other materials of collar 322 within the via hole.

In an implementation, the cylinders or other objects of the collar can be different sizes. For example, a first cylinder can be thicker than a second cylinder. In another example, the first cylinder can be thinner than the second cylinder. In such embodiments, breaking the pillar-type device 318 into multiple subsets having different diameter (or perimeter, for non-geometric shapes) layers can be to minimize leakage paths along sidewalls and better encapsulation of materials. In at least one embodiment, pillar 320 can be formed of multiple materials, of the same size, approximately same size, or of different size.

The pillar 320 can comprise conducting material, such as a p-type polycrystalline silicon p-type polycrystalline, SiGe, and the like. In some embodiments, the bottom layer of the collar 322 (e.g., at least a portion of a first cylinder) is a switching material (e.g., an RSL or RSM, as described herein). However, in other embodiments the switching material can be at a different layer of the collar 322 (e.g., middle layer, etc.). Further, at the top of the collar 322 (e.g., at least a portion of a second cylinder) can be a conducting connection, formed of a conducting material.

According to one or more of the disclosed aspects, the materials used are low thermal budget materials that do not impact IC foundry CMOS at sub 45 nm nodes (e.g., High K gate dielectric metal gate process, or others). For instance, materials selected for pillar 320 and collar 322 can be processed within a thermal budget of CMOS circuitry associated with memory architecture 300. Additionally, the materials can be processed within existing spatial models for the metal layers. Further, the unit processes are compatible with small nodes without impacting the CMOS circuitry.

In an embodiment, memory architecture 300 can be fabricated by forming a first insulating layer over a CMOS substrate, and forming M3 metal layer 302 over the first insulating layer. M3 metal layer 302 can be formed into one or more segments of M3 metal layer 302, by patterning and etching, grooving and filling, via etching and filling, or the like. A second insulating layer is formed above M3 metal layer 302, and one or more via holes are formed within the second insulating layer. The one or more via holes can be filled with conductive material to form a first set of conductive plugs 306. A M4 metal layer 308 can be formed above the second insulating layer and conductive plugs 306. In a first embodiment, respective layers of pillar-type device(s) 316 can be deposited, patterned and etched above M4 metal layer 308 to form the pillar-type devices 316, which can be buried in a third insulating layer and polished so that a top surface of the third insulating layer and of pillar-type devices 316 is substantially co-planar. In a second embodiment, a third insulating layer can be formed over M4 metal layers 308, and a set of vias, trenches, grooves, etc., can be formed within the third insulating layer. The vias/trenches/grooves can be iteratively deposited with respective layers of pillar-type devices 316. Additional insulating material can be deposited and polished to a top surface of the respective layers of pillar-type devices 316, or alternatively the respective layers of pillar-type devices 316 can be polished flat to a top surface of the third insulating layer. M5 metal layer 312 can then be deposited and segmented to form segments of M5 metal layer 312. A fourth insulating layer can be deposited above M5 metal layers, and one or more additional conductive vias 314 formed within the fourth insulating layer. Additionally, M6 metal layer 304 can then be deposited and segmented to form segments of M6 metal layer 304.

With reference to FIG. 3, some resistive memory devices use a pillar and collar type architecture sandwiched between two metal backend layers. A purpose of breaking the pillar device into at least two concentric cylindrical layers can be to minimize leakage paths along sidewalls and better encapsulation of materials. However, the memory device might be limited by lithography as it relates to scaling. In at least some embodiments of the memory device architecture of FIG. 3, a dimension establishing the technology node of memory device 316 can be a surface area providing electrical contact between the pillar and the collar (or top cylinder).

In the art, this dimension establishing the technology node of a memory cell is generally referred to as a critical dimension. This term is utilized with the same meaning throughout this disclosure; however it should be appreciated that the term is not to be construed to limit the disclosure or appended claims to a particular embodiment or a particular dimension, as some embodiments will have a technology node established by one critical dimension (e.g., electrical contact surface area between pillar 320 and collar 322) whereas other embodiments will have a technology node established by another critical dimension (e.g., electrical contact surface area shared by a metal layer serving as an electrode for the memory device and a switching layer of the memory device; see FIG. 4, infra). Further, it should be appreciated that the critical dimension(s) is not limited to a particular quantity, as disclosed memory devices can scale below 20 nm in some embodiments, and even down to 1 nm technology nodes and below in other embodiments.

Further, scaling to smaller geometries for a two-terminal memory cell (e.g., RRAM, and so on) can become expensive. With the one or more aspects disclosed herein, it is possible to extend the scalability of the two-terminal memory cell in a manufacturing facility without the need for advanced lithography. For example, an architecture that is formed by a pillar changed to a via can be utilized wherein the device size is controlled by a contact area between a thin bottom electrode layer (e.g., controlled by film thickness) and a via liner (e.g., controlled by film thickness). The one or more aspects disclosed herein can also effectively enable scaling two-terminal memory on CMOS by using the same, or a lower, cost and lower resolution lithography tools.

Figure 4:
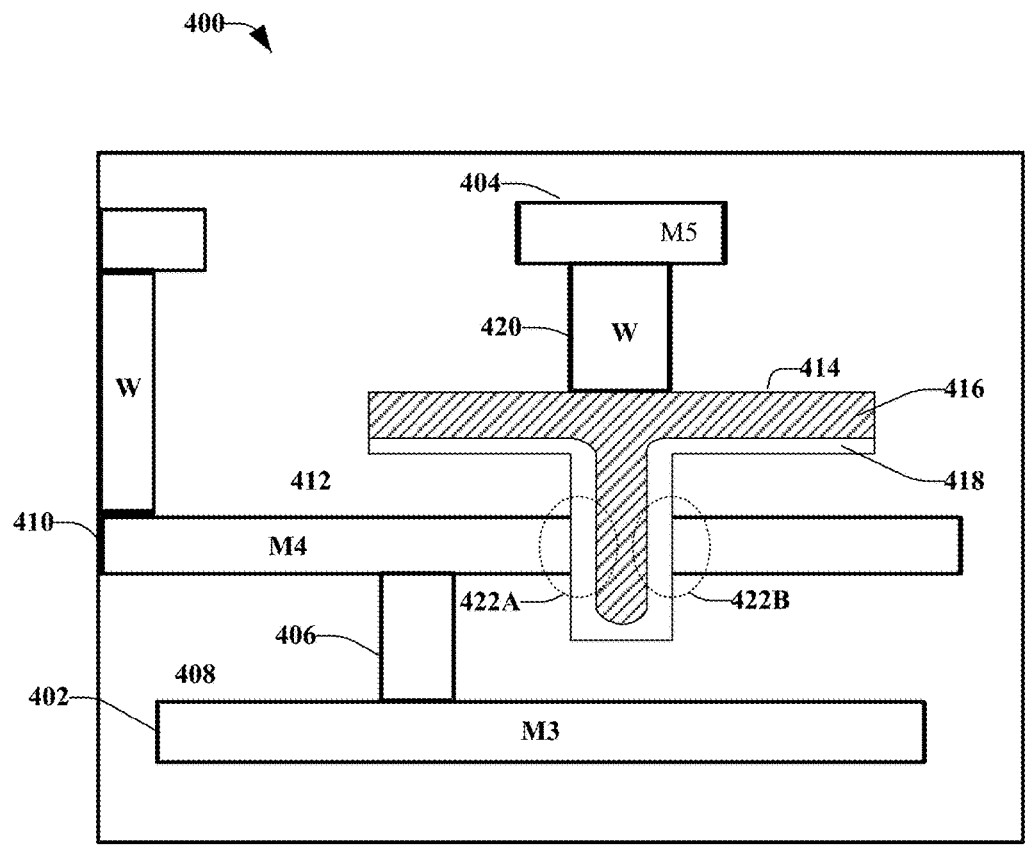
FIG. 4 depicts a block diagram of a cross-sectional view of an intermediate stage in the manufacture of another example memory architecture for a memory device, according to one or more embodiments of the subject disclosure.

FIG. 4 depicts a block diagram of a cross-sectional view of an intermediate stage in the manufacture of another example memory architecture 400 for a memory device, according to one or more embodiments of the subject disclosure. Similar to the memory architecture 300 of FIG. 3, it is noted that the memory architecture 400 is shown built between a first set of metals, M3 metal layers 402, and a second set of metals, M5 metal layers 404. Various components of the memory architecture 400 that are included below the M3 metal layers 402 (e.g., metals M1, metals M2, gate level components, CMOS circuitry, and so on) are not illustrated or described for purposes of simplicity. Further, sets of metals above the M5 metal layers 404 can be included in the memory architecture 400, but are not illustrated or described for purposes of simplicity. In various embodiments, metal layers 402, 404, 410 can serve as wordlines, bitlines, source lines, data lines, or select lines for memory architecture 400, or the like, or suitable combinations of the foregoing.

In various embodiments, one or more of metal layers 402, 404, 410 can be segmented into multiple segments of the respective metal layer(s) 402, 404, 420. For instance, metal layer M5 404 (or metal layer M3 402, metal layer M4 410, or other metal layers not depicted by FIG. 4) can be divided into multiple respective segments of metal layer M5 404. In some disclosed embodiments, a first subset of the segments can be connected to control circuitry of memory architecture 400 (e.g., a power source, a ground, a sensing circuitry, and so forth) and a second subset of the segments can be electrically isolated from (direct) contact with the control circuitry, and left floating. Thus, in some embodiments, a segment of metal layer M5 404 can serve as a floating (e.g., unpowered, ungrounded, etc.) contact for an electronic component (e.g., a memory cell), whereas in other embodiments the segment of metal layer M5 404 can be driven by control circuitry or sensing circuitry, thereby serving as a control contact or sensing contact, or both, for the electronic component. Segments of metal layers 402, 404, 410 can be formed by patterning and etching respective metal layers 402, 404, 410, forming vias between respective segments and filling the vias with insulator material, forming grooves between respective segments and filling the grooves with insulator material, or the like, or a suitable combination of the foregoing.

Memory architecture 400 can comprise a substrate having one or more CMOS devices formed therein or thereon (not depicted). One or more metal layers and intervening insulator layers can be formed (e.g., deposited, etc.) on a top surface of the substrate and below metal layer M3 402, in some disclosed embodiments. These metal layers and intervening insulator layers can be patterned, etched, polished, grooved, etc., to form suitable electronic devices or electronic circuitry. The circuitry can provide electrical contact for subsets of the CMOS devices, in some embodiments, peripheral electronic devices or functionality for subsets of the CMOS devices, and so on. In other embodiments, however, memory architecture 400 can have no intervening layers between the substrate and metal layer M3 402, some but not all of the above intervening layers, or some but not all of the suitable electronic devices or electronic circuitry, to achieve a desired electronic device.

In further embodiments, a first insulating layer 408 can be formed (e.g., deposited, and so on) above metal layer M3 402. One or more conductive plugs 406 (e.g., W) can be formed within first insulating layer 408. The conductive plug(s) 406 can connect a respective portion(s) of the M3 metal layers 402 with an associated portion(s) of another set of metals, M4 metal layers 410. In an embodiment, conductive plug(s) 406 can be formed by creating a via within first insulating layer 408, and filling the via at least in part with a selected conductive material (e.g., W, etc.). Other mechanisms for forming the conductive plug(s) 406 are considered within the scope of the subject disclosure, such as forming a groove(s) in first insulating layer 408 and filling the groove(s) with material selected for conductive plug(s) 406, or the like. Although conductive plug(s) 406 is depicted as having vertical sides, it should be appreciated that this is for illustrative purposes only, and other geometries (or non-geometric shapes) can be implemented as well, such as slanted sides, curved sides, irregular sides, non-geometric sides, and so forth, as suitable.

An additional metal layer, metal layer M4 410 can be formed over first insulating layer 408. At least a subset(s) of metal layer M4 410 can be formed in direct electrical contact with conductive plug(s) 406, in an embodiment. In further embodiments, metal layer M4 410 can be segmented into multiple metal layer segments, as described above. In various embodiments, M4 metal layers 410 may be a conductive layer formed of various metal materials (e.g., TiN, W, Al, or the like), or conductive silicon-containing material (e.g., p-type polycrystalline silicon, p-type SiGe, doped SiGe, or the like).

A second insulating layer 412 can be formed (e.g., deposited) over the M4 metal layers 410. Formed within the second insulating layer 412 can be a via-type device 414 (e.g., a via, a channel, a trough, and so on). The via-type device 414 can also be formed through the M4 metal layer 410 and into the first insulating layer 408, in one or more embodiments. It is noted that although the via-type device 414 is illustrated between a portion of the M4 metal layers 410 and a portion of the M5 metal layers 404, one or more via-type devices can be included in other places within the memory architecture 400. For example, one or more via-type devices can be located between the M3 metal layers 402 and the M4 metal layers 410, between the M3 metal layers 402 and the M5 metal layers 404, between the M5 metal layers 404 and a M6 metal layer (not shown), or between other sets of metal backend layers (not shown), between a disclosed metal layer and a non-disclosed metal layer, or in at least one embodiment between a metal layer and a metal interconnect (e.g., in electrical contact with a conductive plug 406 and a metal layer, or between two conductive plugs, or some other suitable orientation).

Further, additional via-type devices can be included between multiple sets of metal layers. For example, at least one via-type device can be formed between the M4 metal layers 410 and the M5 metal layers 404 and at least another via-type device can be formed between the M5 metal layers 404 and a M6 metal layers (not shown), or between other metals or metal layers. Thus, the via-type device(s) can be sandwiched between any metal layers including any further backend metal layers, although such metal layers are not illustrated.

The via-type device(s) can be formed with suitable etching techniques, grooving techniques, or similar techniques for removing at least a subset of material of stacked semiconductor films or layers. Similar to the memory architecture 300 described with respect to FIG. 3, during the process of inserting via devices(s) between sets of the metal interconnects (e.g., between the M4 metal layers 410 and the M5 metal layers 404), the spacing between the metal layers does not widen or narrow, or does not substantially widen or narrow in at least some disclosed embodiments. For example, the height between the respective M4 metal layers 410 and the respective M5 metal layers 404 can remain constant or substantially constant. To illustrate, the height of the via-type device can have a total height that is the same, or substantially the same, as a height between the respective M4 metal layers 410 and the respective M5 metal layers 404 before placement of the via-type device. In such a manner, existing dielectrics (e.g., the dielectric used before placement of the via-type device(s), between the respective sets of metal layers) can be utilized without changing or substantially changing expected capacitances between metal layers. Further, various other existing processes used in the fabrication of an integrated circuit can continue to be utilized to manufacture the example memory architecture 400.

As depicted, via-type device 414 can comprise a vertical portion (or approximately vertical portion) intersecting a horizontal portion (or approximately horizontal portion), in some disclosed embodiments. In a first embodiment, second insulating layer 412 can be formed to an initial height, substantially equal to a bottom surface of the horizontal portion of via-type device 414. After formation of via-type device 414, a further depositing of second insulating layer 412 can bring second insulating layer 412 to a bottom surface of M5 metal layers 404. Other embodiments can utilize other steps to achieve this or similar orientation.

Upon formation of second insulating layer 412, a via (or, e.g., a trench, groove, and so on) can be formed within the second insulating layer 412 to form a gap where the vertical portion is depicted. The via-type device 414 (or multiple via devices), can result in exposed sidewall portions of respective ones of the insulating layers or metal layers. By filling at least a subset of the exposed sidewall portions with respective layers of via-type device 414, a two-terminal memory cell(s) can be formed along a non-vertical direction (e.g., horizontal direction, substantially horizontal direction, oblique direction, and so forth) with respect to the orientation of FIG. 4. For example, a first two-terminal memory cell 422A can be formed (left-side dotted oval) at an intersection of a left side of via-type device and M4 metal layers 410 and a second two-terminal memory cell 422B can be formed at an intersection of a right side of via-type device 414 and M4 metal layers 410, in at least some embodiments. By way of example, formation of the via-type device 414 can include forming a first portion 416 by thin film deposition, or other suitable technique, of a first material. At least a subset of remaining space formed by the via can be filled by a second portion 418 of the via-type device 414, wherein the second portion 418 includes a second material, which can be different from the first material.

In various embodiments, the second portion 418 is a resistive switching material layer, such as undoped amorphous silicon material layer, non-stoichiometric silicon oxide, or the like. The resistive switching material layer can serve as a non-volatile switching component of two-terminal memory cells 422A, 422B, in an embodiment. The first portion 416 may be an active metal layer (e.g., Ag, Au, Al, or the like) that serves as a common first electrode for two-terminal memory cells 422A, 422B. The via-type device 414 may also include a thin barrier material layer between the first portion 416 and the second portion 418, such as Ti, W, TiN, or the like. Further, respective subsets of M4 metal layers 410 can be independently controlled, sensed, etc., to provide separate and respective second electrodes for two-terminal memory cells 422A, 422B, enabling individual operation thereon.

In various embodiments, a plug 420 may be formed between the via-type device 414 and the M5 metal layers 404. The plug 420 may be formed of a conductive material (e.g., Ti, W, TiN, or the like). According to an aspect, the via-type device can be formed using a W plug process to connect aluminum (Al), copper (Cu), a suitable compound or alloy thereof, or any other suitable metallization scheme. For example, as discussed herein, a W plug can be used for making a metal contact. According to an aspect, second insulating layer 412 can be formed to a height substantially equivalent to a bottom surface of M5 metal layers 404 (whether before or after formation of via-type device 414), and a via hole can be formed within the second insulating layer 412 down to and exposing a top surface of via-type device 414. The W plug can be formed by filling the via hole with W, such that the top surface of via-type device 414 can make direct electrical contact with the plug 420. A top surface of second insulating layer 412 can then be polished, in some embodiments, to provide a top surface of plug 420 to be flat or substantially flat with the top surface of second insulating layer 412. M5 metal layer 404 can then be deposited above the top surfaces of plug 420 and second insulating layer 412 so that at least a subset of M5 metal layer 404 is in electrical contact with plug 420. Thus, at least the subset of M5 metal layer 404 can be in electrical contact with the top surface of via-type device 414 by way of plug 420.

As mentioned above, the via-type device 414 can form one or more two-terminal memory cells 422A, 422B oriented along a non-vertical angle (e.g., oblique angle, etc.). The memory cells 422A, 422B can be created at respective junctions of first portion 416, second portion 418 and a left subset of M4 metal layer 410 and a right subset of M4 metal layer 410. As a result, a critical dimension of two-terminal memory cells 422A, 422B can be established by a smallest common surface area facilitating electrical conductivity through respective ones of the junctions. In one embodiment, the smallest electrical contact surface area can be a (respective) side-wall surface of M4 metal layer 410 in direct electrical contact with respective subsets of second portion 418 of via-type device 414 (as depicted within the respective dotted ovals). Accordingly, controlling a thickness of M4 metal layer can effectively scale the respective two-terminal memory cells 422A, 422B. Further, this thickness can be controlled with thin film thickness techniques, and in at least some embodiments can be implemented without scaling printed features utilizing lithographic techniques. As compared to FIG. 3, for example, the layer of the M4 metal layer 410 may be formed thinner than the comparable M4 metal layers 308 of FIG. 3 to form two-terminal memory cells 422A, 422B as a smaller technology node. According to an aspect, the thinner the M4 layer, the smaller the device. Thus, the memory device can be scaled by controlling the metal bottom electrode thickness, which can be controlled down to 50 A or 5 nm, for example, though in other embodiments thinner or thicker M4 layers are anticipated (e.g., 20 nm, 1 nm, etc.). Examples of materials for the bottom electrode layer can include, among others: tungsten (W), aluminum (Al), or the like, or suitable combinations thereof.

Further, the pillar-type device 316 of FIG. 3 is changed to a via-type device 414 in FIG. 4. The liner of the via-type device 414 can comprise select and switching layers, in some embodiments. Further, a collar material of the via-type device 414 can comprise a simple conducting material. Examples of materials for the pillar changed to via liner layer can include, among others: Silicon Oxide (SiOx), a compound of SiOx and Titanium Oxide (TiOx), and a compound of SiOx and Aluminum Oxide (AlOx), or the like, or suitable or combinations thereof. Examples of materials for filling the pillar layer can include, among others, Al, a compound of Al and Copper (Cu), a compound of Al, Ti, and Titanium nitride (TiN), and a combination of Al and Cu, Al and Cu or TiN. Examples of materials for the top electrode (e.g., second metal layer 112 of FIG. 1) can include, among others: Al, TiN, or other suitable compounds of Al and TiN. In some examples, the top electrode can be formed of many other materials including tantalum (Ta), tantalum nitride (TiN), Cu, or the like, or suitable combinations thereof.

As illustrated, the via can be both through (or partially through, in some embodiments) the second electrode metal (e.g., the M4 metal layers 410). The critical dimension can be a surface area in direct electrical contact between the second electrode metal (e.g., M4 metal layer 410) and via-type device 414. Further, this surface area can affect electrical resistivity of two-terminal memory cells 422A, 422B, by restricting current density through the cells. Because a via can be formed having a variety of cross-section shapes or sizes, the shape/size of the via utilized for via-type device 414 can also affect this critical dimension surface area, and thus the electrical resistivity of two-terminal memory cells 422A, 422B. Thus, in at least one embodiment, the critical dimension can be modulated at least in part by controlling a size or a shape of the via utilized for via-type device 414.

According to some implementations, a via can be drilled through a multiple bottom electrode (BE) stack (e.g., multiple metal layers), which can allow for three (or another number) of devices to be included on the same via. According to some aspects, the bottom electrode can be a semiconductor. In further embodiments, an oblique angle along which two-terminal memory cells 422A, 422B are oriented can be selected to provide for an enhanced electrical field (E-field) that can reduce the via form (e.g., width or length) as compared to a planar device.

According to one or more of the disclosed aspects, the memory device architecture utilizes smaller CMOS devices and can improve memory efficiency. Further, the memory device architecture of the various aspects disclosed herein can be made using materials that are already existing in most IC foundry facilities. Further, the integration scheme can enable device scaling to 5 nm without the need to use a manufacturing toolset that is typical of a 5 nm (or smaller) technology node (e.g., no retooling is needed). For example, with 44 nm or 193 nm lithography toolset, a sub 20 nm device can be made using the disclosed aspects.

According to an implementation, the pillar-type device or via-type device may include one or more materials representing a selector device, such as a Crossbar FAST™ selection device. In some embodiments, the selector device can include a selector layer the can be a non-stoichiometric material having volatile, bipolar switching characteristics. Examples of suitable materials for selector layer can include $SiO_X$, $TiO_X$, $AlO_X$, $WO_X$, $Ti_XN_YO_Z$, or the like, or suitable combinations thereof, where x, y and z can be suitable non-stoichiometric values. In at least one embodiment of the present disclosure, the selector layer can be doped with a metal(s) during fabrication, to achieve a target resistance or conductance characteristic. Further to the above, the selector device can comprise an ion conductor layer$_1$ or an ion conductor layer$_2$. Ion conductor layer$_1$ or ion conductor layer$_2$ can comprise a solid electrolyte (e.g., Ag—Ge—S, Cu—Ge—S, Ag—Ge—Te, Cu—Ge—Te, etc.), a metal-oxide alloy (e.g., AgSiO$_2$, and so forth), or the like.

In view of the exemplary diagrams described above, process methods that can be implemented in accordance with the disclosed subject matter will be better appreciated with reference to the following flow charts. While for purposes of simplicity of explanation, the methods are shown and described as a series of blocks, it is to be understood and appreciated that the claimed subject matter is not limited by the order of the blocks, as some blocks may occur in different orders or concurrently with other blocks from what is depicted and described herein. Moreover, not all illustrated blocks are necessarily required to implement the methods described herein. Additionally, it should be further appreciated that the methods disclosed throughout this specification are capable of being stored on an article of manufacture to facilitate transporting and transferring such methodologies to an electronic device. The term article of manufacture, as used, is intended to encompass a computer program accessible from any computer-readable device, device in conjunction with a carrier, or storage medium.

Figure 5:
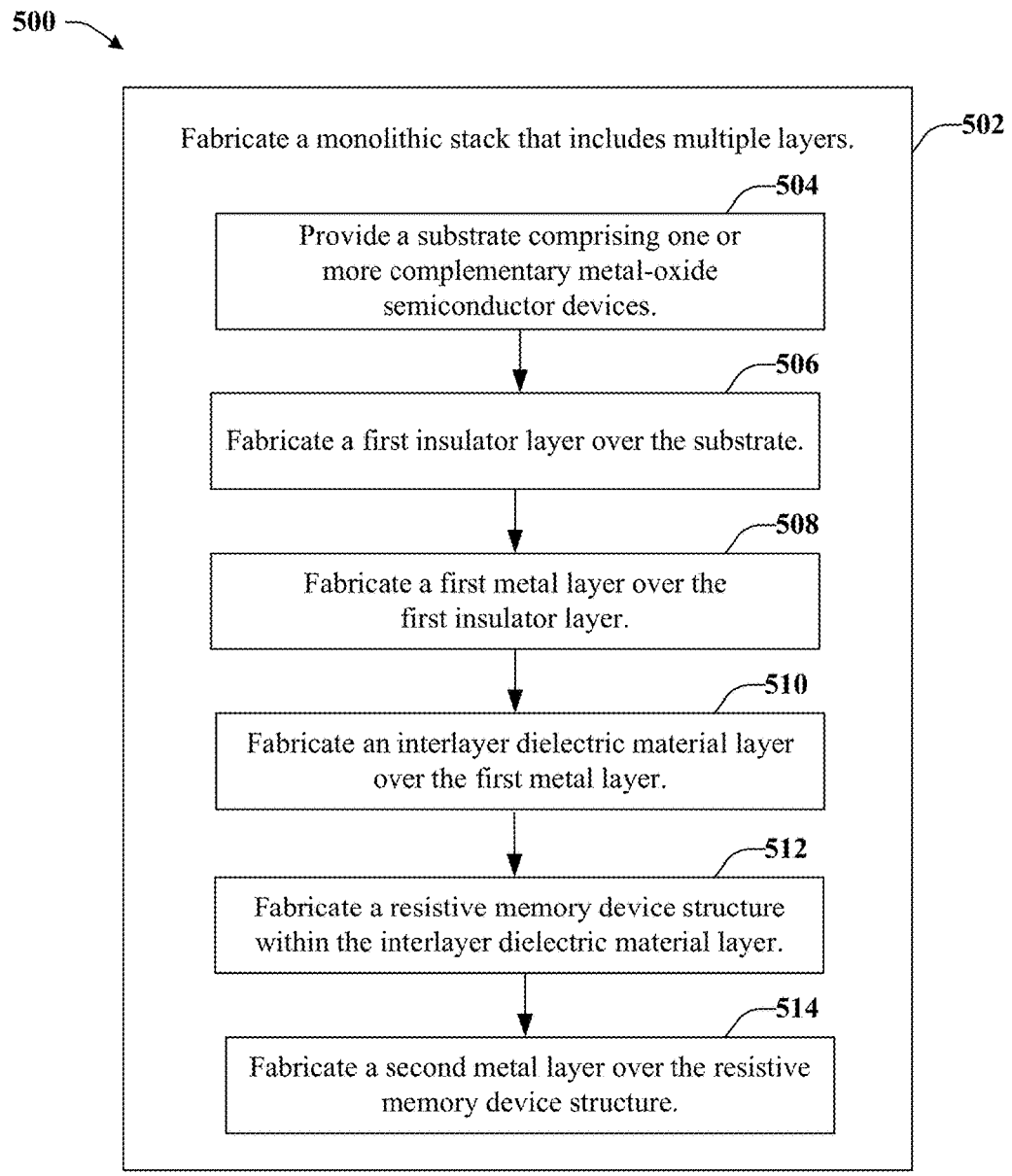
FIG. 5 illustrates a flowchart of an example, non-limiting method for fabricating a memory cell comprising a resistive memory using integrated-circuit foundry compatible processes, according to various aspects of the subject disclosure.

FIG. 5 illustrates a flowchart of an example, non-limiting method 500 for fabricating a memory cell that includes a resistive memory device using integrated-circuit foundry compatible processes, according to various aspects of the subject disclosure. At 502, method 500 can comprise fabricating a monolithic stack that includes multiple layers over a substrate. The monolithic stack can be fabricated as part of a monolithic process over a substrate comprising a complementary metal-oxide semiconductor circuitry layer. Further, the fabricating can be performed within a thermal budget of the substrate.

Thus, fabricating the monolithic stack can include, at 504, providing a substrate that includes one or more complementary metal-oxide semiconductor (CMOS) devices. For example, in one embodiment, the substrate could be provided that includes one or more CMOS devices formed therein. In an alternative embodiment, the one or more CMOS devices can be fabricated at least in part within and at least in part above, the substrate. In another embodiment, the substrate can be provided having one or more pre-existing CMOS devices, and method 500 can further comprise fabricating one or more additional CMOS devices in, on, or above, the substrate.

At 506, a first insulator layer is fabricated over the substrate and a first metal layer is fabricated, at 508, over the first insulator layer. The first insulator layer can be configured to electrically isolate the substrate from the first metal layer.

At 510, an interlayer dielectric material layer is fabricated over the first metal layer. Further, a resistive memory device structure is fabricated, at 512, within the interlayer dielectric material layer. For example, the resistive memory device may be implemented as a pillar-type device in electrical contact with at least the first metal layer. According to another example, the resistive memory device may be implemented as a via-type device. Further, to this example, the via device can be formed in electrical contact with at least the first metal layer.

A second metal layer is fabricated, at 514, over the resistive memory device structure. In various embodiments, a distance between the first metal layer and the second metal layer can be substantially similar to a distance between the second metal layer and a third metal layer. In other embodiments, method 500 can form the resistive memory device structure while maintaining a target distance (e.g., a predetermined distance established by an electrical design model) between the first metal layer and the second metal layer.

According to an implementation, fabricating the monolithic stack can include fabricating the monolithic stack at a temperature of about 450 degrees Celsius or lower. In one specific implementation, the monolithic stack can be fabricated at a temperature between about 400 and 450 degrees Celsius. In another implementation, the monolithic stack can be fabricated at a temperature between about 350 and 400 degrees Celsius. In yet another implementation, the monolithic stack can be fabricated at a temperature between about 300 and 350 degrees Celsius.

Figure 6:
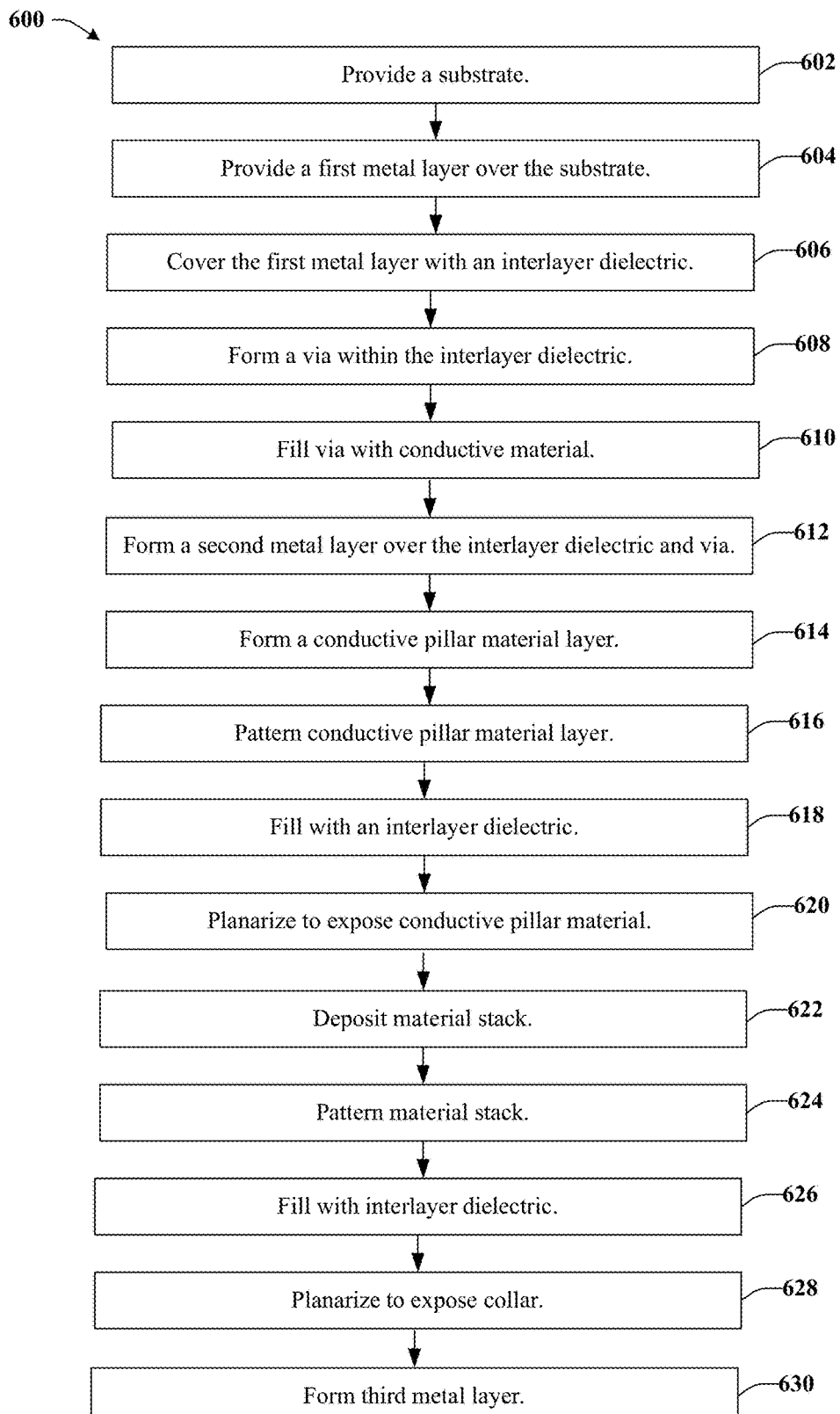
FIG. 6 illustrates a flow chart of an example, non-limiting method for fabricating a memory cell that comprises a monolithically integrated resistive memory formed as a pillar device, according to various aspects of the subject disclosure.

FIG. 6 illustrates a flow chart of an example, non-limiting method 600 for fabricating a memory cell that comprises a monolithically integrated resistive memory formed as a pillar device, according to various aspects of the subject disclosure. The method 600 of FIG. 6 can be utilized to fabricate, for example, the memory cell 100 of FIG. 1 in some embodiments. In other embodiments, method 600 can be utilized to fabricate the memory architecture 300 of FIG. 3.

Method 600 begins, at 602, when a substrate is provided. The substrate can be the CMOS 102 of FIG. 1 or a subset of the M3 metal layers 302 of FIG. 3. In one embodiment, the substrate provided has one or more CMOS devices formed therein. In an alternative embodiment, the one or more CMOS devices can be fabricated on or within the substrate. In a further embodiment, the substrate can be provided with one or more CMOS devices formed therein and further, one or more additional CMOS devices can be fabricated on or within the substrate.

At 604, a first metal layer is provided over the substrate. In some implementations, the first metal layer can be a subset of the CMOS 102 of FIG. 1 or the M3 metal layers 304 of FIG. 3. For example, the first metal layer (e.g., M3 metal layers 304) is provided as a part of the substrate. In another example, the first metal layer (e.g., M3 metal layers 304) is formed on top of the substrate comprising the one or more CMOS devices. According to an implementation, before the first metal layer is formed over the substrate, an insulating layer (e.g., an interlayer dielectric) is disposed over the substrate and the first metal layer is formed over the insulating layer.

The first metal layer can be covered with an interlayer dielectric, at 606. The interlayer dielectric can be the first insulating layer 106 of FIG. 1 or the first insulator layer, for example. The interlayer dielectric is used to electrically insulate the metal layers. In one or more embodiments, the interlayer dielectric is a dielectric material used to electrically separate closely spaced arrays of patterned conductive lines of a memory device (e.g., metal wordlines, bitlines, data lines, source lines, select lines, and so forth). The interlayer dielectric can comprise an insulator that has a dielectric constant k that is relatively low (e.g., close to 1). Having a low dielectric constant k can minimize capacitive coupling (e.g., electrical cross signals or effects) between adjacent metal lines. According to an aspect, a low k dielectric is a dielectric material that has a dielectric constant k that is lower than 3.9, which is k of silicon dioxide (SiO$_2$).

At 608, a via can be formed through (or within) the interlayer dielectric. The via can be, for example, a contact, a vertical contact, a conductor, and so forth. In one implementation, a via can be formed within at least a portion of the interlayer dielectric. The via can be filled with a conductive material, at 610. For example, the via filled with the conductive material can be the V3 contacts 306 of FIG. 3. According to various implementations, the via can be formed with suitable etching techniques, grooving techniques, or similar techniques for removing material of stacked semiconductor films or layers.

At 612, a second metal layer can be formed over the interlayer dielectric and the via. The second metal layer can be the M4 metal layers 308 of FIG. 3. According to an implementation, the second metal layer may be patterned.

According to some implementations, forming the second metal layer can include forming one or more discontinuities (e.g., segments) in the second metal layer. The discontinuities can be created in one embodiment by creating one or more vias between subsets of the second metal layer to create the discontinuities. In another embodiment, the discontinuity can be formed by patterning the second metal layer, for example, a mask can be provided over the second metal layer (e.g., the M4 layer), except over areas of the second metal layer comprising the discontinuity. The second metal layer can then be etched to remove material uncovered by the mask, thereby providing the discontinuity. Afterward, the mask can be removed. The discontinuities in the second metal layer can be filled with a dielectric material, according to an embodiment.

A conductive material layer can be formed, at 614. At 616 the conductive pillar material layer can be patterned to form a conductive structure (e.g., pillar device, pillar-type device, etc.). At 618, the patterned conductive structure can be filled with an interlayer dielectric. Further, at 620, the interlayer dielectric can be planarized to expose at least a top surface of the conductive structure.

At 622, a material stack is deposited comprising respective layers of materials. For example, the material stack can include a resistive switching material layer, such as undoped amorphous silicon material layer, a non-stoichiometric silicon oxide, or the like. The material stack can also include an active metal layer (e.g., Ag, Au, Al, or the like). Further, the material stack can include a barrier material layer between the resistive switching material and the active metal material layer, such as Ti, W, TiN, or the like. In various embodiments, a top cap may be of a conductive material (e.g., Ti, W, TiN, or the like). The material stack can be patterned, at 624, to create a collar-type structure. In one or more embodiments, the material stack can be patterned and etched to form a material stack structure on top of the conductive structure formed at reference numbers 616 and 618, above. Further, the material stack structure can be formed to have a first perimeter that is of different length than a second perimeter of the conductive structure. This difference in perimeter lengths—the material stack structure having a first perimeter length stacked on top of the conductive structure having a second perimeter length—can reduce leakage current about the material stack structure, and provide better encapsulation of materials within an insulating dielectric layer.

At 626, method 600 can comprise filling with another interlayer dielectric layer. Then, at 628, planarize to expose a top surface of the material stack structure. Further, at 630, a third metal layer (e.g., M5 metal layers 312 of FIG. 3) is formed over the top surface of the material stack structure and the other interlayer dielectric layer. According to an implementation, the third metal layer can be patterned, etched and filled (with insulating material) to form respective third metal layer segments.

As described herein, a pillar material layer can include a pillar device that can include a pillar-type structure (of a contact material) formed on a metal layer and a collar-type structure disposed on top of the pillar-type structure. The collar-type structure can include two or more layers of materials arranged in a stack-like structure above the pillar-type structure. The cross-section of the collar-type structure can be larger than the pillar-type structure (e.g., having a larger perimeter, as mentioned above). In some embodiments, the two or more layers can include a first layer in a cylinder-type structure disposed above a second cylinder-type structure. The second cylinder-type structure contacts the metal layer at a first surface, and a second surface coupled to the first cylinder-type structure. Further to this implementation, the first cylinder-type structure has a first side that contacts the pillar-type structure and a second side that contacts the second surface of the second cylinder-type structure. The first surface and the second surface can be located on opposite sides of the second cylinder-like structure.

According to another implementation, the resistive memory device structure can include a pillar device. The pillar device can include a pillar structure that includes conducting material and a first overlying material layer that includes a switching material and a second overlying material layer that includes an active conductor material. Further to this implementation, the first overlying material layer is characterized by a first thickness and the second overlying material layer is characterized by a second thickness different from the first thickness.

Figure 7:
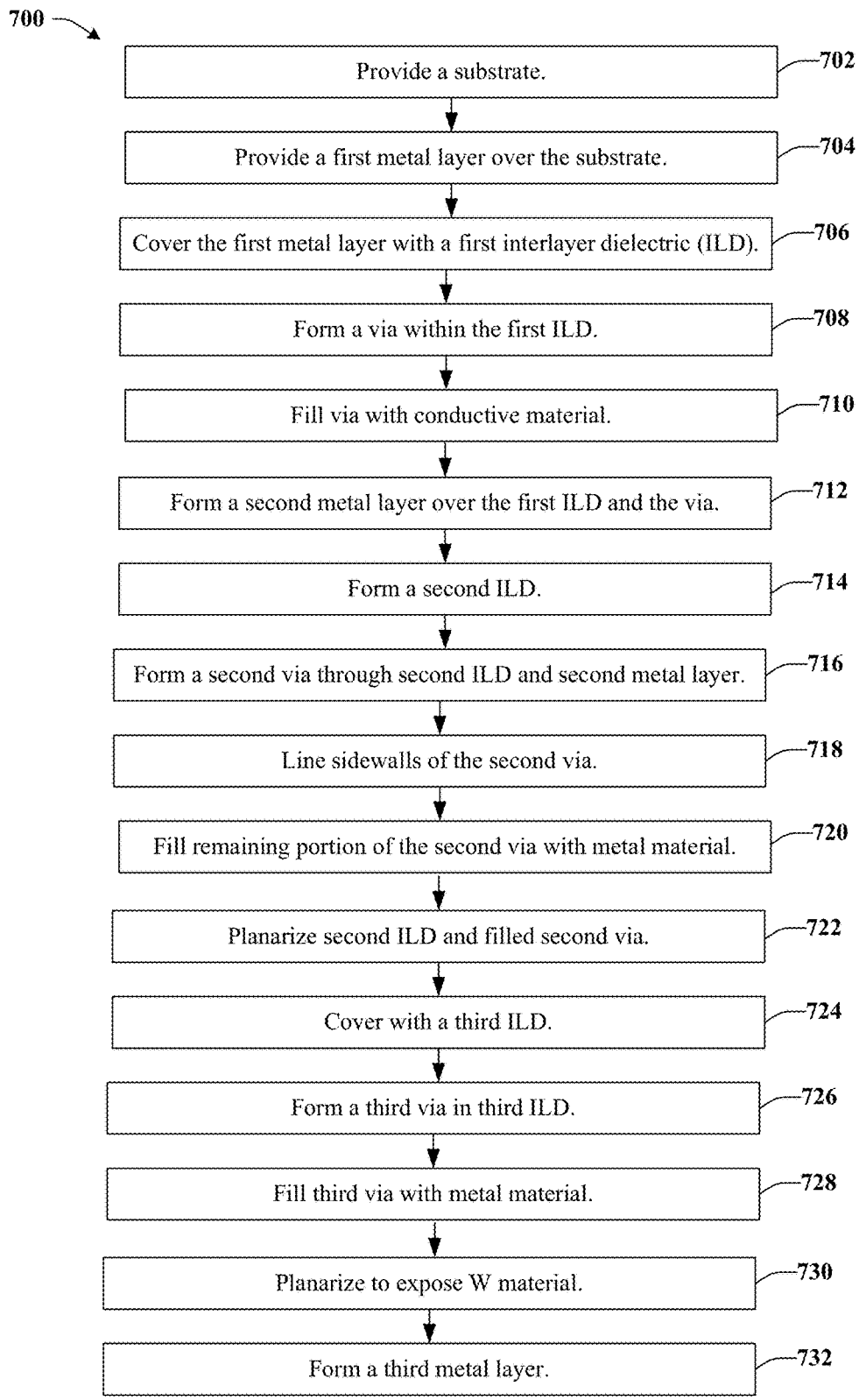
FIG. 7 illustrates a flow chart of an example, non-limiting method for fabricating a memory cell that comprises a monolithically integrated resistive memory device formed as a via device, according to various aspects of the subject disclosure.

FIG. 7 illustrates a flow chart of an example, non-limiting method 700 for fabricating a memory cell that comprises a monolithically integrated resistive memory device formed as a via device, according to various aspects of the subject disclosure. The method 700 of FIG. 7 can be utilized to fabricate, for example, the memory cell 200 of FIG. 2 and/or the memory architecture 400 of FIG. 4.

At 702 and a substrate is provided. In one embodiment, the substrate provided has one or more CMOS devices formed therein. In an alternative embodiment, the one or more CMOS devices can be fabricated on or within the substrate. In a further embodiment, the substrate can be provided with one or more CMOS devices formed therein and further, one or more additional CMOS devices can be fabricated on or within the substrate.

A first metal layer is provided over the substrate, at 704. In some implementations, the first metal layer is the M3 metal layers 404 of FIG. 4. For example, the first metal layer (e.g., M3 metal layers 404) can be provided as a part of the substrate. In another example, the first metal layer (e.g., M3 metal layers 404) can be formed on top of the substrate comprising the one or more CMOS devices. According to an implementation, before the first metal layer is formed over the substrate, an insulating layer (e.g., an interlayer dielectric) is disposed over the substrate and the first metal layer is formed over the insulating layer.

A first interlayer dielectric can be formed over the first metal layer, at 706. The interlayer dielectric is used to electrically insulate the metal layers. In further, detail the interlayer dielectric is a dielectric material used to electrically separate closely spaced interconnect lines (e.g., metal layers). The interlayer dielectric can comprise an insulator that has a dielectric constant k that is as low as possible (e.g., as close to 1 as possible). Having a low dielectric constant k can minimize capacitive coupling (e.g., cross talk) between adjacent metal lines. According to an aspect, a low k dielectric is a dielectric material that has a dielectric constant k that is lower than 3.9, which is k of silicon dioxide (SiO$_2$).

At 708, a via can be formed through the interlayer dielectric. According to various implementations, the via can be formed with suitable etching techniques, grooving techniques, or similar techniques for removing material of stacked semiconductor films or layers. The via can be, for example, a contact, a vertical contact, a conductor, and so forth. In one implementation, a via can be formed within at least a portion of the interlayer dielectric. The via can be filled with a conductive material, at 710. For example, the via filled with the conductive material can be the V3 contacts 406 of FIG. 4.

A second metal layer can be formed over the interlayer dielectric and the via, at 712. The second metal layer can be the M4 metal layers 408 of FIG. 4. According to an implementation, the second metal layer can be patterned.

Another interlayer dielectric layer can be formed at 714. The other interlayer dielectric layer can be formed over the second metal layer and can be utilized to electrically isolate the second metal layer from subsequent layers.

At 716, a second via is formed through a portion of the other interlayer dielectric layer and a portion of the second metal layer. Sidewalls of the second via are lined, at 718. According to an implementation, the sidewalls are lined with a resistive switching material layer.

A remaining portion of the second via is filled with a metal material, at 720. In one embodiment, the metal material used to fill the remaining portion of the second via can be an active metal. In another embodiment, second metal layer can be formed of the active metal, and in such case the material used to fill the remaining portion of the second via can be a material selected from Al, Al and Cu, Al with Tin, Al with Ti or TiN, TiN, Al and Cu or TiN, or suitable combinations thereof. A top of the other interlayer dielectric and second via are planarized, at 722.

The planarized interlayer dielectric and second via can be covered with a third interlayer dielectric, at 724. Further, a third via is formed in the third interlayer dielectric at 726. The third via can be formed down toward the top surface of the filled second via.

At 728, the third via is filled with metal material. For example, the metal material can be W or a similar material. The third interlayer dielectric and third via are planarized to expose the W material, at 730. Further, a third metal layer is formed, at 732. The third metal layer can be patterned according to an aspect.

As discussed herein provided is a monolithic integration of resistive memory with CMOS using IC foundry processes. The disclosed aspects are thermal budget acceptable and plasma damage acceptable, which can be based on various design considerations. Further, the connection scheme as discussed herein is provided with IC foundry process for multiple schemes using W plug process to connect to aluminum, copper, or any other metallization scheme, according to an aspect. Further, through utilization of the disclosed aspects, there is little, if any, impact to design rule and electrical mode for other devices in the circuitry. In addition, the one or more disclosed aspects have a lower cost, lower parasitic considerations, and smaller chip sizes as compared to other processes.

In various embodiments of the subject disclosure, disclosed memory architectures can be employed as a stand-alone or integrated embedded memory device with a CPU or microcomputer. Some embodiments can be implemented, for instance, as part of a computer memory (e.g., random access memory, cache memory, read-only memory, storage memory, or the like). Other embodiments can be implemented, for instance, as a portable memory device. Examples of suitable portable memory devices can include removable memory, such as a secure digital (SD) card, a universal serial bus (USB) memory stick, a compact flash (CF) card, or the like, or suitable combinations of the foregoing. (See, for example, FIGS. 8 and 9, infra).

NAND FLASH is employed for compact FLASH devices, USB devices, SD cards, solid state drives (SSDs), and storage class memory, as well as other form-factors. Although NAND has proven a successful technology in fueling the drive to scale down to smaller devices and higher chip densities over the past decade, as technology scaled down past 25 nanometer (nm) memory cell technology, several structural, performance, and reliability problems became evident. Such considerations have been addressed by the disclosed aspects.

Figure 8:
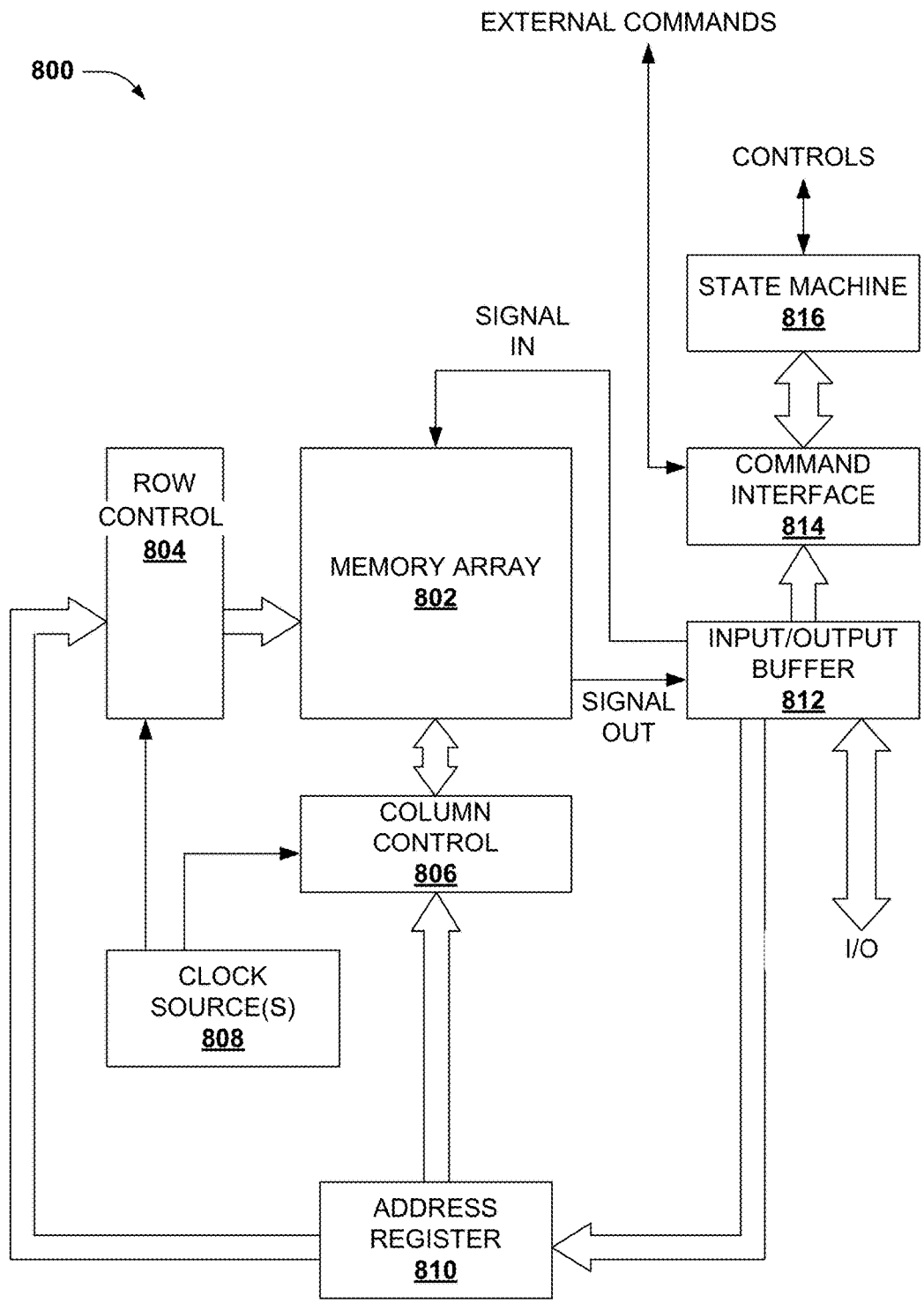
FIG. 8 depicts a block diagram of a sample operating environment for facilitating implementation of one or more disclosed embodiments.

In order to provide a context for the various aspects of the disclosed subject matter, FIG. 8, as well as the following discussion, is intended to provide a brief, general description of a suitable environment in which various aspects of the disclosed subject matter can be implemented or processed. While the subject matter has been described above in the general context of semiconductor architectures and process methodologies for fabricating and operating such architectures, those skilled in the art will recognize that the subject disclosure also can be implemented in combination with other architectures or process methodologies. Moreover, those skilled in the art will appreciate that the disclosed processes can be practiced with a processing system or a computer processor, either alone or in conjunction with a host computer (e.g., computer 902 of FIG. 9, infra), which can include single-processor or multiprocessor computer systems, mini-computing devices, mainframe computers, as well as personal computers, hand-held computing devices (e.g., PDA, smart phone, watch), microprocessor-based or programmable consumer or industrial electronics, and the like. The illustrated aspects may also be practiced in distributed computing environments where tasks are performed by remote processing devices that are linked through a communications network. However, some, if not all aspects of the subject innovation can be practiced on stand-alone electronic devices, such as a memory card, Flash memory module, removable memory, or the like. In a distributed computing environment, program modules can be located in both local and remote memory storage modules or devices.

FIG. 8 illustrates a block diagram of an example operating and control environment 800 for a memory cell array 802 according to aspects of the subject disclosure. In at least one aspect of the subject disclosure, memory cell array 802 can comprise a variety of memory cell technology. Particularly, memory cell array 802 can comprise resistive switching memory cells having rectifier characteristics, as described herein.

A row controller 804 or a column controller 806 can be formed adjacent to memory cell array 802. Moreover, column controller 806 can be electrically coupled with bit lines of memory cell array 802. Column controller 806 can control respective bitlines, applying suitable program, erase or read voltages to selected bitlines.

The row controller 804 can be formed adjacent to column controller 806, and electrically connected with word lines of memory cell array 802. Row controller 804 can select particular rows of memory cells with a suitable selection voltage. Moreover, row controller 804 can facilitate program, erase or read operations by applying suitable voltages at selected word lines.

A clock source(s) 808 can provide respective clock pulses to facilitate timing for read, write, and program operations of row controller 804 and column controller 806. Clock source(s) 808 can further facilitate selection of word lines or bit lines in response to external or internal commands received by operating and control environment 800. An input/output buffer 812 can be connected to an external host apparatus, such as a computer or other processing device (not depicted, but see, for example, computer 902 of FIG. 9, infra) by way of an I/O buffer or other I/O communication interface. Input/output buffer 812 can be configured to receive write data, receive an erase instruction, output readout data, and receive address data and command data, as well as address data for respective instructions. Address data can be transferred to row controller 804 and column controller 806 by an address register 810. In addition, input data is transmitted to memory cell array 802 via signal input lines, and output data is received from memory cell array 802 via signal output lines. Input data can be received from the host apparatus, and output data can be delivered to the host apparatus via the I/O buffer.

Commands received from the host apparatus can be provided to a command interface 814. Command interface 814 can be configured to receive external control signals from the host apparatus, and determine whether data input to the input/output buffer 812 is write data, a command, or an address. Input commands can be transferred to a state machine 816.

State machine 816 can be configured to manage programming and reprogramming of memory cell array 802. State machine 816 receives commands from the host apparatus via input/output buffer 812 and command interface 814, and manages read, write, erase, data input, data output, and similar functionality associated with memory cell array 802. In some aspects, state machine 816 can send and receive acknowledgments and negative acknowledgments regarding successful receipt or execution of various commands.

To implement read, write, erase, input, output, etc., functionality, state machine 816 can control clock source(s) 808. Control of clock source(s) 808 can cause output pulses configured to facilitate row controller 804 and column controller 806 implementing the particular functionality. Output pulses can be transferred to selected bit lines by column controller 806, for instance, or word lines by row controller 804, for instance.

In connection with FIG. 8, the systems and processes described below can be embodied within hardware, such as a single integrated circuit (IC) chip, multiple ICs, an application specific integrated circuit (ASIC), or the like. Further, the order in which some or all of the process blocks appear in each process should not be deemed limiting. Rather, it should be understood that some of the process blocks can be executed in a variety of orders, not all of which may be explicitly illustrated herein.

Figure 9:
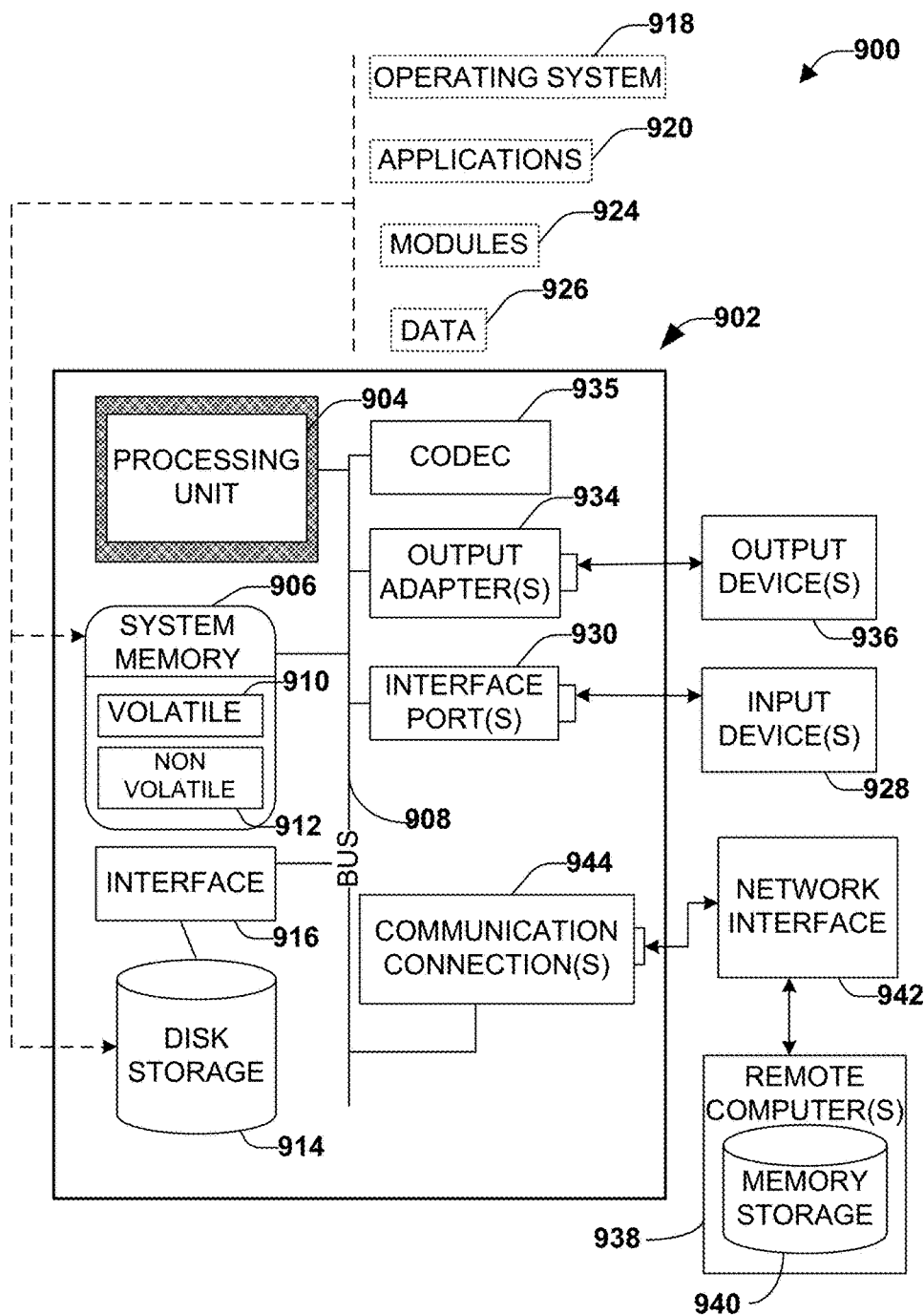
FIG. 9 illustrates a block diagram of an example computing environment that can be implemented in conjunction with various embodiments.

With reference to FIG. 9, a suitable operating environment 900 for implementing various aspects of the claimed subject matter includes a computer 902. The computer 902 includes a processing unit 904, a system memory 906, a codec 935, and a system bus 908. The system bus 908 couples system components including, but not limited to, the system memory 906 to the processing unit 904. The processing unit 904 can be any of various available processors. Dual microprocessors and other multiprocessor architectures also can be employed as the processing unit 904.

The system bus 908 can be any of several types of bus structure(s) including the memory bus or memory controller, a peripheral bus or external bus, or a local bus using any variety of available bus architectures including, but not limited to, Industrial Standard Architecture (ISA), Micro-Channel Architecture (MSA), Extended ISA (EISA), Intelligent Drive Electronics (IDE), VESA Local Bus (VLB), Peripheral Component Interconnect (PCI), Card Bus, Universal Serial Bus (USB), Advanced Graphics Port (AGP), Personal Computer Memory Card International Association bus (PCMCIA), Firewire (IEEE 1394), and Small Computer Systems Interface (SCSI).

The system memory 906 includes volatile memory 910 and non-volatile memory 912, which can employ one or more of the disclosed memory architectures, in various embodiments. The basic input/output system (BIOS), containing the basic routines to transfer information between elements within the computer 902, such as during start-up, is stored in non-volatile memory 912. In addition, according to present innovations, codec 935 may include at least one of an encoder or decoder, wherein the at least one of an encoder or decoder may consist of hardware, software, or a combination of hardware and software. Although, codec 935 is depicted as a separate component, codec 935 may be contained within non-volatile memory 912.

By way of illustration, and not limitation, non-volatile memory 912 can include read only memory (ROM), programmable ROM (PROM), electrically programmable ROM (EPROM), electrically erasable programmable ROM (EEPROM), or Flash memory. Non-volatile memory 912 can employ one or more of the disclosed memory architectures, in at least some disclosed embodiments. Moreover, non-volatile memory 912 can be computer memory (e.g., physically integrated with computer 902 or a mainboard thereof), or removable memory. Examples of suitable removable memory with which disclosed embodiments can be implemented can include a secure digital (SD) card, a compact Flash (CF) card, a universal serial bus (USB) memory stick, or the like. Volatile memory 910 includes cache memory, or random access memory (RAM), which acts as external cache memory, and can also employ one or more disclosed memory architectures in various embodiments. By way of illustration and not limitation, RAM is available in many forms such as static RAM (SRAM), dynamic RAM (DRAM), synchronous DRAM (SDRAM), double data rate SDRAM (DDR SDRAM), and enhanced SDRAM (ESDRAM), and so forth.

Computer 902 may also include removable/non-removable, volatile/non-volatile computer storage medium. FIG. 9 illustrates, for example, disk storage 914. Disk storage 914 includes, but is not limited to, devices such as a magnetic disk drive, solid state disk (SSD) floppy disk drive, tape drive, Jaz drive, Zip drive, LS-100 drive, flash memory card, or memory stick. In addition, disk storage 914 can include storage medium separately or in combination with other storage medium including, but not limited to, an optical disk drive such as a compact disk ROM device (CD-ROM), CD recordable drive (CD-R Drive), CD rewritable drive (CD-RW Drive) or a digital versatile disk ROM drive (DVD-ROM). To facilitate connection of the disk storage 914 to the system bus 908, a removable or non-removable interface is typically used, such as interface 916. It is appreciated that disk storage 914 can store information related to a user. Such information might be stored at or provided to a server or to an application running on a user device. In one embodiment, the user can be notified (e.g., by way of output device(s) 936) of the types of information that are stored to disk storage 914 or transmitted to the server or application. The user can be provided the opportunity to opt-in or opt-out of having such information collected or shared with the server or application (e.g., by way of input from input device(s) 928).

It is to be appreciated that FIG. 9 describes software that acts as an intermediary between users and the basic computer resources described in the suitable operating environment 900. Such software includes an operating system 918. Operating system 918, which can be stored on disk storage 914, acts to control and allocate resources of the computer 902. Applications 920 take advantage of the management of resources by operating system 918 through program modules 924, and program data 926, such as the boot/shutdown transaction table and the like, stored either in system memory 906 or on disk storage 914. It is to be appreciated that the claimed subject matter can be implemented with various operating systems or combinations of operating systems.

A user enters commands or information into the computer 902 through input device(s) 928. Input devices 928 include, but are not limited to, a pointing device such as a mouse, trackball, stylus, touch pad, keyboard, microphone, joystick, game pad, satellite dish, scanner, TV tuner card, digital camera, digital video camera, web camera, and the like. These and other input devices connect to the processing unit 904 through the system bus 908 via interface port(s) 930. Interface port(s) 930 include, for example, a serial port, a parallel port, a game port, and a universal serial bus (USB). Output device(s) 936 use some of the same type of ports as input device(s) 928. Thus, for example, a USB port may be used to provide input to computer 902 and to output information from computer 902 to an output device 936. Output adapter 934 is provided to illustrate that there are some output devices, such as monitors, speakers, and printers, among other output devices, which require special adapters. The output adapter 934 can include, by way of illustration and not limitation, video and sound cards that provide a means of connection between the output device 936 and the system bus 908. It should be noted that other devices or systems of devices provide both input and output capabilities such as remote computer(s) 938.

Computer 902 can operate in a networked environment using logical connections to one or more remote computers, such as remote computer(s) 938. The remote computer(s) 938 can be a personal computer, a server, a router, a network PC, a workstation, a microprocessor based appliance, a peer device, a smart phone, a tablet, or other network node, and typically includes many of the elements described relative to computer 902. For purposes of brevity, only a memory storage device 940 is illustrated with remote computer(s) 938. Remote computer(s) 938 is logically connected to computer 902 through a network interface 942 and then connected via communication connection(s) 944. Network interface 942 encompasses wire or wireless communication networks such as local-area networks (LAN) and wide-area networks (WAN) and cellular networks. LAN technologies include Fiber Distributed Data Interface (FDDI), Copper Distributed Data Interface (CDDI), Ethernet, Token Ring and the like. WAN technologies include, but are not limited to, point-to-point links, circuit switching networks such as Integrated Services Digital Networks (ISDN) and variations thereon, packet switching networks, and Digital Subscriber Lines (DSL).

Communication connection(s) 944 refers to the hardware/software employed to connect the network interface 942 to the system bus 908. While communication connection 944 is shown for illustrative clarity inside computer 902, it can also be external to computer 902. The hardware/software necessary for connection to the network interface 942 includes, for exemplary purposes only, internal and external technologies such as, modems including regular telephone grade modems, cable modems and DSL modems, ISDN adapters, and wired and wireless Ethernet cards, hubs, and routers.

The illustrated aspects of the disclosure may also be practiced in distributed computing environments where certain tasks are performed by remote processing devices that are linked through a communications network. In a distributed computing environment, program modules or stored information, instructions, or the like can be located in local or remote memory storage devices.

Moreover, it is to be appreciated that various components described herein can include electrical circuit(s) that can include components and circuitry elements of suitable value in order to implement the embodiments of the subject disclosure. Furthermore, it can be appreciated that many of the various components can be implemented on one or more IC chips. For example, in one embodiment, a set of components can be implemented in a single IC chip. In other embodiments, one or more of respective components are fabricated or implemented on separate IC chips.

As utilized herein, terms "component," "system," "architecture" and the like are intended to refer to a computer or electronic-related entity, either hardware, a combination of hardware and software, software (e.g., in execution), or firmware. For example, a component can be one or more transistors, a memory cell, an arrangement of transistors or memory cells, a gate array, a programmable gate array, an application specific integrated circuit, a controller, a processor, a process running on the processor, an object, executable, program or application accessing or interfacing with semiconductor memory, a computer, or the like, or a suitable combination thereof. The component can include erasable programming (e.g., process instructions at least in part stored in erasable memory) or hard programming (e.g., process instructions burned into non-erasable memory at manufacture).

By way of illustration, both a process executed from memory and the processor can be a component. As another example, an architecture can include an arrangement of electronic hardware (e.g., parallel or serial transistors), processing instructions and a processor, which implement the processing instructions in a manner suitable to the arrangement of electronic hardware. In addition, an architecture can include a single component (e.g., a transistor, a gate array, and so on) or an arrangement of components (e.g., a series or parallel arrangement of transistors, a gate array connected with program circuitry, power leads, electrical ground, input signal lines and output signal lines, and so on). A system can include one or more components as well as one or more architectures. One example system can include a switching block architecture comprising crossed input/output lines and pass gate transistors, as well as power source(s), signal generator(s), communication bus(ses), controllers, I/O interface, address registers, and so on. It is to be appreciated that some overlap in definitions is anticipated, and an architecture or a system can be a stand-alone component, or a component of another architecture, system, etc.

In addition to the foregoing, the disclosed subject matter can be implemented as a method, apparatus, or article of manufacture using typical manufacturing, programming or engineering techniques to produce hardware, firmware, software, or any suitable combination thereof to control an electronic device to implement the disclosed subject matter.

The terms "apparatus" and "article of manufacture" where used herein are intended to encompass an electronic device, a semiconductor device, a computer, or a computer program accessible from any computer-readable device, carrier, or media. Computer-readable media can include hardware media, or software media. In addition, the media can include non-transitory media, or transport media. In one example, non-transitory media can include computer readable hardware media. Specific examples of computer readable hardware media can include but are not limited to magnetic storage devices (e.g., hard disk, floppy disk, magnetic strips, and so on), optical disks (e.g., compact disk (CD), digital versatile disk (DVD), and so forth), smart cards, and flash memory devices (e.g., card, stick, key drive, and so on). Computer-readable transport media can include carrier waves, or the like. Of course, those skilled in the art will recognize many modifications can be made to this configuration without departing from the scope or spirit of the disclosed subject matter.

What has been described above includes examples of the subject innovation. It is, of course, not possible to describe every conceivable combination of components or methodologies for purposes of describing the subject innovation, but one of ordinary skill in the art can recognize that many further combinations and permutations of the subject innovation are possible. Accordingly, the disclosed subject matter is intended to embrace all such alterations, modifications and variations that fall within the spirit and scope of the disclosure. Furthermore, to the extent that a term "includes", "including", "has" or "having" and variants thereof is used in either the detailed description or the claims, such term is intended to be inclusive in a manner similar to the term "comprising" as "comprising" is interpreted when employed as a transitional word in a claim.

Moreover, the word "exemplary" is used herein to mean serving as an example, instance, or illustration. Any aspect or design described herein as "exemplary" is not necessarily to be construed as preferred or advantageous over other aspects or designs. Rather, use of the word exemplary is intended to present concepts in a concrete fashion. As used in this application, the term "or" is intended to mean an inclusive "or" rather than an exclusive "or". That is, unless specified otherwise, or clear from context, "X employs A or B" is intended to mean any of the natural inclusive permutations. That is, if X employs A; X employs B; or X employs both A and B, then "X employs A or B" is satisfied under any of the foregoing instances. In addition, the articles "a" and "an" as used in this application and the appended claims should generally be construed to mean "one or more" unless specified otherwise or clear from context to be directed to a singular form.

Additionally, some portions of the detailed description have been presented in terms of algorithms or process operations on data bits within electronic memory. These process descriptions or representations are mechanisms employed by those cognizant in the art to effectively convey the substance of their work to others equally skilled. A process is here, generally, conceived to be a self-consistent sequence of acts leading to a desired result. The acts are those requiring physical manipulations of physical quantities. Typically, though not necessarily, these quantities take the form of electrical or magnetic signals capable of being stored, transferred, combined, compared, or otherwise manipulated.

It has proven convenient, principally for reasons of common usage, to refer to these signals as bits, values, elements, symbols, characters, terms, numbers, or the like. It should be borne in mind, however, that all of these and similar terms are to be associated with the appropriate physical quantities and are merely convenient labels applied to these quantities. Unless specifically stated otherwise or apparent from the foregoing discussion, it is appreciated that throughout the disclosed subject matter, discussions utilizing terms such as processing, computing, replicating, mimicking, determining, or transmitting, and the like, refer to the action and processes of processing systems, or similar consumer or industrial electronic devices or machines, that manipulate or transform data or signals represented as physical (electrical or electronic) quantities within the circuits, registers or memories of the electronic device(s), into other data or signals similarly represented as physical quantities within the machine or computer system memories or registers or other such information storage, transmission or display devices.

In regard to the various functions performed by the above described components, architectures, circuits, processes and the like, the terms (including a reference to a "means") used to describe such components are intended to correspond, unless otherwise indicated, to any component which performs the specified function of the described component (e.g., a functional equivalent), even though not structurally equivalent to the disclosed structure, which performs the function in the herein illustrated exemplary aspects of the embodiments. In addition, while a particular feature may have been disclosed with respect to only one of several implementations, such feature may be combined with one or more other features of the other implementations as may be desired and advantageous for any given or particular application. It will also be recognized that the embodiments include a system as well as a computer-readable medium having computer-executable instructions for performing the acts or events of the various processes.

What is claimed is:

1. A method of fabricating a memory device, comprising:
providing a substrate comprising one or more complementary metal-oxide semiconductor devices;
fabricating a first insulator layer over the substrate;
fabricating a first metal layer over the first insulator layer;
fabricating an interlayer dielectric material layer over the first metal layer;
fabricating a via through at least a subset of the interlayer dielectric material layer;
forming a plurality of material layers over at least a subset of an exposed surface of the interlayer dielectric material layer formed in response to the fabricating the via and within a thermal budget of the one or more complementary metal-oxide semiconductor devices, the plurality of material layers forming a subset of a resistive memory device structure; and
fabricating a second metal layer over the resistive memory device structure and forming at least a third metal layer over the second metal layer, wherein a first distance between the first metal layer and the second metal layer is substantially equal to a second distance between the second metal layer and the third metal layer.

2. The method of claim 1, wherein fabricating the via further comprises forming the via through the interlayer dielectric material layer and at least partially through the first metal layer.

3. The method of claim 2, wherein forming the plurality of material layers further comprises forming a first portion of one of the plurality of material layers in direct contact with a first surface of the first metal layer exposed by the fabricating the via, and further comprises forming a second portion of the one of the plurality of material layers in direct contact with a second surface of the first metal layer exposed by the fabricating the via.

4. The method of claim 1, wherein the forming the plurality of material layers further comprises:
depositing a thin film material comprising aluminum, copper or silver, over at least the subset of the exposed surface; and
depositing at least a second material over the thin film material to fill at least a subset of the remaining space created by fabricating the via, the second material comprising Al, Al and Cu, Al with TiN, Al with Ti or TiN, TiN, Al and Cu, or TiN, or a suitable combination of the foregoing.

5. The method of claim 1, wherein the forming the plurality of material layers is conducted at a range of temperatures selected from a group of temperature ranges consisting of: from about 450 degrees Celsius to about 400 degrees Celsius, from about 350 degrees Celsius to about 400 degrees Celsius, from about 300 degrees Celsius to about 350 degrees Celsius, and from about 250 degrees Celsius to about 300 degrees Celsius.

6. The method of claim 1, further comprising patterning and etching the first metal layer and the second metal layer into respective pluralities of first metal layer segments and second metal layer segments, wherein the resistive memory device structure is in direct electrical contact with one of the plurality of first metal layer segments, or one of the plurality of second metal layer segments.

7. The method of claim 6, further comprising forming a conductive plug providing indirect electrical contact between the resistive memory device structure and either the one of the plurality of first metal layer segments or the one of the plurality of second metal layer segments.

8. The method of claim 1, wherein the forming the via comprises forming a first portion of the via with a first cross-section size and forming a second portion of the via with a second cross-section size that is different from the first cross-section size.

9. The method of claim 8, wherein the first cross-section size is a first diameter and the second cross-section size is a second diameter.

10. The method of claim 8, wherein the first cross-section size is a first cross-sectional area and the second cross-section size is a second cross-sectional area.

11. The method of claim 8, wherein the first cross-section size is a first perimeter length and the second cross-section size is a second perimeter length.

12. The method of claim 8, wherein the forming the plurality of material layers comprises forming a resistive switching material layer in the first portion of the via and forming an active metal material in the second portion of the via.

13. The method of claim 1, further comprising forming at least one additional material layer in the via, the at least one additional material layer forming a selector device.

14. The method of claim 13, wherein the at least one additional material layer comprises a selector layer comprising a non-stoichiometric material.

15. The method of claim 14, wherein the non-stoichiometric material has a bipolar switching characteristic.

16. A method of fabricating a memory device, comprising:
fabricating a first insulator layer over a substrate that comprises one or more complementary metal-oxide semiconductor devices formed on or within the substrate;
fabricating a first metal layer over the first insulator layer;
fabricating a second insulating layer over the first metal layer;
forming a via within a subset of the second insulating layer to a depth that exposes at least a top surface of the first metal layer;
filling the via with a conductive material to form a conductive structure in electrical contact with the top surface of the first metal layer;
planarizing the top surface of the second insulating layer and the conductive structure;
forming a second metal layer over the planarized top surface of the interlayer dielectric material layer and the conductive structure;
fabricating an interlayer dielectric material layer over the second metal layer;
fabricating a second via through the interlayer dielectric material layer and through at least a subset of a thickness of the second metal layer;
filling the second via with a material layer stack comprising a plurality of materials that, in conjunction with an exposed surface of the second metal layer, form a two-terminal memory device;
planarizing a top surface of the interlayer dielectric material layer; and
forming a third metal layer over the top surface of the interlayer dielectric material layer and forming at least a fourth metal layer over the third metal layer, wherein a first distance between the second metal layer and the third metal layer is substantially equal to a second distance between the third metal layer and the fourth metal layer.

17. The method of claim 16, further comprising forming a conductive plug over the top surface of the interlayer dielectric material layer, the conductive plug facilitating electrical contact between the third metal layer and the two-terminal memory device.

18. The method of claim 16, further comprising segmenting into a plurality of metal layer segments at least one metal layer selected from the group consisting of: the first metal layer, the second metal layer, and the third metal layer.

19. The method of claim 18, wherein segmenting into the plurality of metal layer segments further comprises patterning and etching the at least one metal layer, forming a set of vias within the at least one metal layer and filling the set of vias with insulating material, or forming a set of grooves or trenches within the at least one metal layer and filling the set of grooves or trenches with the insulating material.

20. The method of claim 16, wherein the fabricating the second via comprises forming a first portion of the second via with a first cross-section size and forming a second portion of the second via with a second cross-section size that is different from the first cross-section size.

* * * * *